(12) United States Patent
Lin et al.

(10) Patent No.: US 11,864,393 B2
(45) Date of Patent: *Jan. 2, 2024

(54) MEMORY DEVICE, INTEGRATED CIRCUIT DEVICE AND METHOD

(71) Applicant: TAIWAN SEMICONDUCTOR MANUFACTURING COMPANY, LTD., Hsinchu (TW)

(72) Inventors: Meng-Han Lin, Hsinchu (TW); Sai-Hooi Yeong, Hsinchu (TW); Han-Jong Chia, Hsinchu (TW); Chenchen Jacob Wang, Hsinchu (TW); Yu-Ming Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/156,734

(22) Filed: Jan. 19, 2023

(65) Prior Publication Data

US 2023/0157034 A1    May 18, 2023

Related U.S. Application Data

(63) Continuation of application No. 17/122,708, filed on Dec. 15, 2020, now Pat. No. 11,581,368.

(Continued)

(51) Int. Cl.
*H10B 63/00* (2023.01)
*G11C 13/00* (2006.01)
(Continued)

(52) U.S. Cl.
CPC ............ *H10B 63/30* (2023.02); *G11C 13/003* (2013.01); *G11C 13/0007* (2013.01);
(Continued)

(58) Field of Classification Search
CPC ...... H10B 63/30; H10B 63/845; H10B 63/80; G11C 13/0007; G11C 13/003;
(Continued)

(56) References Cited

U.S. PATENT DOCUMENTS 11,581,368 B2 *   2/2023   Lin .................. H10N 70/24
2007/0268742 A1   11/2007  Liu
(Continued)

FOREIGN PATENT DOCUMENTS

CN          102544049         7/2012
KR          20170099994       9/2017
(Continued)

OTHER PUBLICATIONS

Office Action dated Mar. 14, 2022 for corresponding case No. KR 10-2021-0017511. (pp. 1-5).
(Continued)

*Primary Examiner* — Fernando Hidalgo
(74) *Attorney, Agent, or Firm* — Hauptman Ham, LLP

(57) ABSTRACT

A memory device includes a bit line, a word line, a memory cell, select bit lines, and a controller. The memory cell includes a first transistor, data storage elements, and second transistors corresponding to the data storage elements. The first transistor includes a gate electrically coupled to the word line, a first source/drain, and a second source/drain. Each of the select bit lines is electrically coupled to a gate of a corresponding second transistor. Each data storage element and the corresponding second transistor are electrically coupled in series between the first source/drain of the first transistor and the bit line. The controller turns ON the first transistor and a selected second transistor, and, while the first transistor and the selected second transistor are turned ON, applies different voltages to the bit line to (Continued)

perform corresponding different operations on the data storage element coupled to the selected second transistor.

20 Claims, 20 Drawing Sheets

Related U.S. Application Data

(60) Provisional application No. 63/040,886, filed on Jun. 18, 2020.

(51) Int. Cl.
  *H10N 70/20* (2023.01)
  *H10N 70/00* (2023.01)

(52) U.S. Cl.
  CPC ....... *G11C 13/0097* (2013.01); *H10B 63/845* (2023.02); *H10N 70/066* (2023.02); *H10N 70/24* (2023.02); *G11C 2213/79* (2013.01)

(58) Field of Classification Search
  CPC ............ G11C 13/0097; G11C 2213/79; G11C 13/0011; G11C 13/0069; G11C 13/0002; G11C 13/0004; G11C 13/0026; G11C 13/0028; H10N 70/066; H10N 70/24; H10N 70/011; H10N 70/20; H10N 70/823; H10N 70/8833
  USPC ......................................................... 365/148
  See application file for complete search history.

(56) References Cited

U.S. PATENT DOCUMENTS

| | | |
|---|---|---|
| 2008/0007993 A1 | 1/2008 | Saitoh et al. |
| 2011/0007581 A1 | 1/2011 | Jung et al. |
| 2013/0121056 A1 | 5/2013 | Liu et al. |
| 2014/0133211 A1 | 5/2014 | Nazarian et al. |
| 2014/0185362 A1 | 7/2014 | Haukness |
| 2014/0291603 A1 | 10/2014 | Song |
| 2014/0353662 A1 | 12/2014 | Shukh |
| 2015/0063025 A1 | 3/2015 | Takekida |
| 2015/0076578 A1 | 3/2015 | Sakamoto et al. |
| 2015/0364186 A1 | 12/2015 | Ryu |
| 2016/0148686 A1 | 5/2016 | Hsu et al. |
| 2019/0267428 A1 | 8/2019 | Wu |
| 2020/0091427 A1 | 5/2020 | Ando et al. |
| 2020/0312396 A1 | 10/2020 | Pyo |
| 2021/0233959 A1 | 7/2021 | Yang et al. |

FOREIGN PATENT DOCUMENTS

| | | |
|---|---|---|
| TW | 202013684 | 4/2020 |
| WO | WO 2017/142619 | 8/2017 |

OTHER PUBLICATIONS

Office Action dated Aug. 15, 2022 from corresponding application No. DE 10 2020 134 374.4 (pp. 1-9).

\* cited by examiner

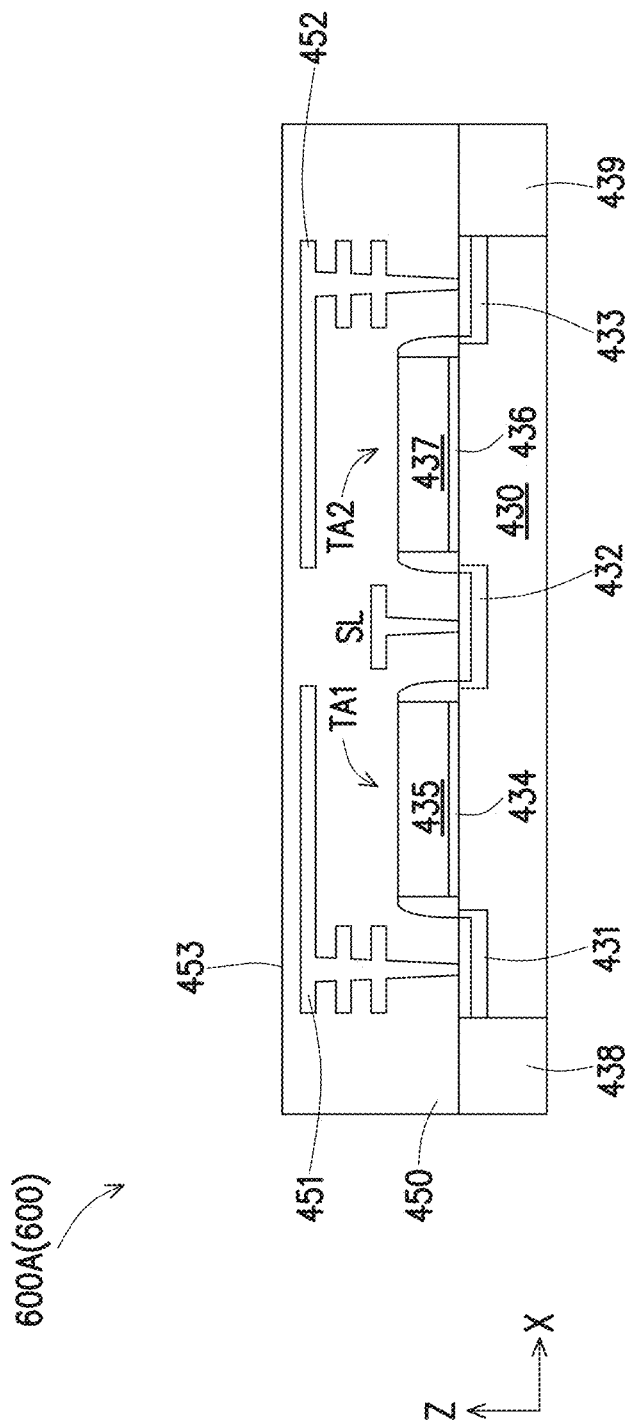

MEMORY DEVICE, INTEGRATED CIRCUIT DEVICE AND METHOD

RELATED APPLICATION(S)

The instant application is a continuation application of U.S. patent application Ser. No. 17/122,708, filed Dec. 15, 2020, now U.S. Pat. No. 11,581,368, issued on Feb. 14, 2023, which claims the benefit of U.S. Provisional Application No. 63/040,886, filed Jun. 18, 2020. The entireties of the above-referenced applications are incorporated by reference herein.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs. Examples of semiconductor devices and cells correspondingly include memory devices and memory cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6H are schematic cross-sectional views and FIGS. 6I-6J are schematic perspective views of an IC device being manufactured at various stages of a manufacturing process, in accordance with some embodiments.

DETAILED DESCRIPTION

Figure 1:
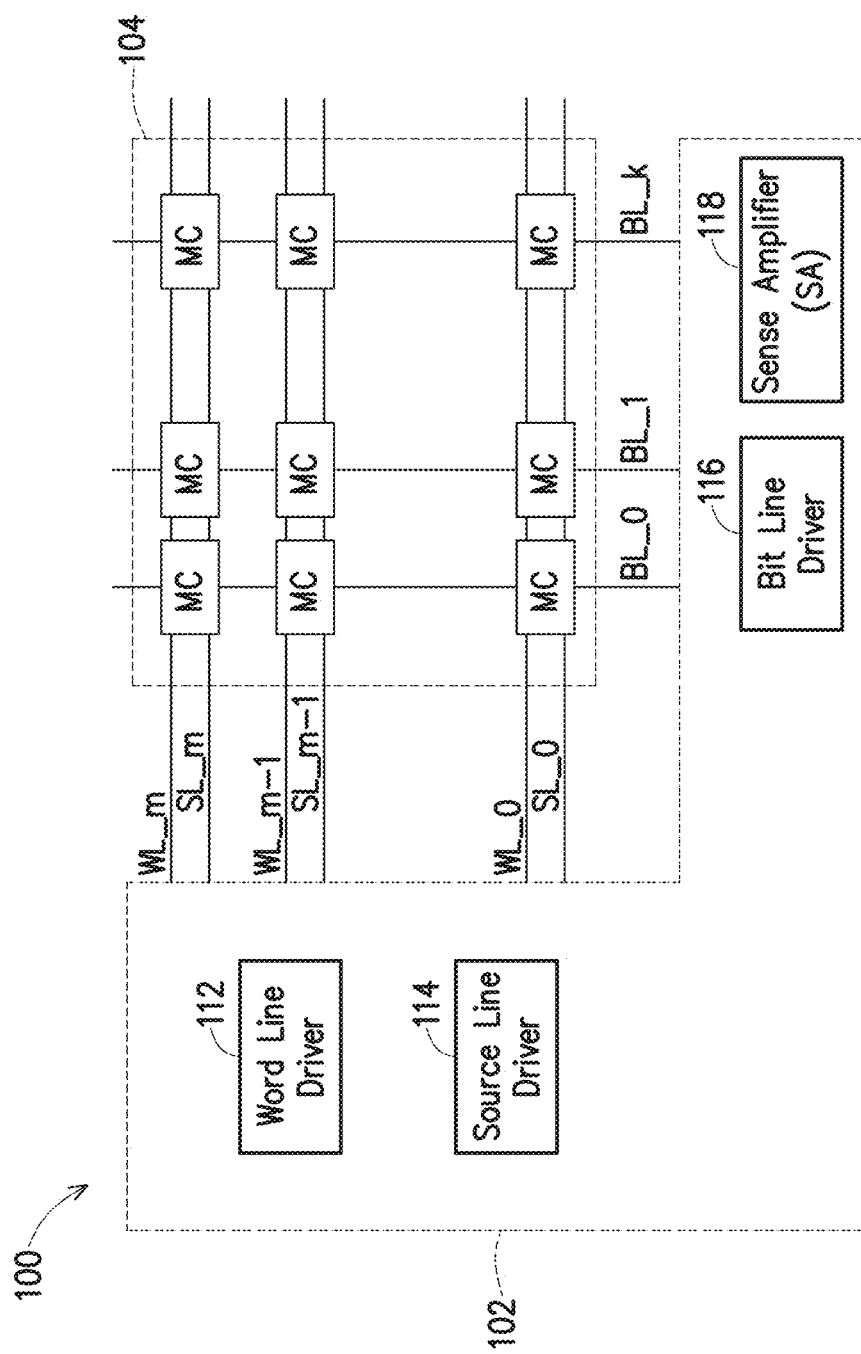
FIG. 1 is a schematic block diagram of a memory device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context.

In some embodiments, a memory cell has an access transistor, a plurality of data storage elements, and a plurality of select transistors corresponding to the plurality of data storage elements. A gate of the access transistor is electrically coupled to a word line. Each of the data storage elements and the corresponding select transistor are electrically coupled in series between a source/drain of the access transistor and a bit line. Gates of the select transistors are electrically coupled to corresponding select bit lines. In at least one embodiment, in a reset operation of a selected data storage element, the access transistor and the select transistor corresponding to the selected data storage element are turned ON, whereas the select transistors corresponding to other data storage elements are turned OFF. As a result, a high voltage for resetting the selected data storage element is prevented from affecting data stored in the other data storage elements. In other words, reset disturb is avoidable in some embodiments. This is an improvement over other approaches. Other advantages achievable in one or more embodiments include, but are not limited to, simple and efficient three-dimensional (3D) stack structure, compatibility with back-end-of-line (BEOL) processes, increased memory density.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell MC, and a controller (also referred to as "control circuit") 102 electrically coupled to the memory cell MC and configured to control operations of the memory cell MC. In the example configuration in FIG. 1, the memory device 100 comprises a plurality of memory cells MC arranged in a plurality of columns and rows in a memory array 104. The memory device 100 further comprises a plurality of word lines WL_0 to WL_m extending along the rows, a plurality of source lines SL_0 to SL_m extending along the rows, and a plurality of bit lines (also referred to as "data lines") BL_0 to BL_k extending along the columns of the memory cells MC. Each of the memory cells MC is electrically coupled to the controller 102 by at least one of the word lines, at least one of the source lines, and at least one of the bit lines. Examples of word lines include, but are not limited to, read word lines for transmitting addresses of the memory cells MC to be read from, write word lines for transmitting addresses of the memory cells MC to be written to, or the like. In at least one embodiment, a set of word lines is configured to perform as both read word lines and write word lines. Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines. In one or more embodiments, each memory cell MC is electrically coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1. In at least one embodiment, the source lines SL are omitted.

In the example configuration in FIG. 1, the controller 102 comprises a word line driver 112, a source line driver 114, a bit line driver 116, and a sense amplifier (SA) 118 which are configured to perform one or more operations including, but not limited to, a read operation, a write operation (or programming operation), and a forming operation. Example write operations include but are not limited to, a set operation and a reset operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is electrically coupled to the memory array 104 via the word lines WL. The word line driver 112 is configured to decode a row address of the memory cell MC selected to be accessed in an operation, such as a read operation or a write operation. The word line driver 112 is configured to supply a voltage to the selected word line WL corresponding to the decoded row address, and a different voltage to the other, unselected word lines WL. The source line driver 114 is electrically coupled to the memory array 104 via the source lines SL. The source line driver 114 is configured to supply a voltage to the selected source line SL corresponding to the selected memory cell MC, and a different voltage to the other, unselected source lines SL. The bit line driver 116 (also referred as "write driver") is electrically coupled to the memory array 104 via the bit lines BL. The bit line driver 116 is configured to decode a column address of the memory cell MC selected to be accessed in an operation, such as a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL. The SA 118 is coupled to the memory array 104 via the bit lines BL. In a read operation, the SA 118 is configured to sense data read from the accessed memory cell MC and retrieved through the corresponding bit lines BL.

In some embodiments described herein, the memory device 100 further comprises select bit lines through which the controller 102 is electrically coupled to the memory cells MC. For example, the select bit lines are coupled to the bit line driver 116.

The described memory device configuration is an example, and other memory device configurations are within the scopes of various embodiments. In at least one embodiment, the memory device 100 is a non-volatile memory, and the memory cells MC are non-volatile memory cells. In at least one embodiment, the memory device 100 is a non-volatile, reprogrammable memory, and the memory cells MC are non-volatile, reprogrammable memory cells. Examples of memory types applicable to the memory device 100 include, but are not limited to, resistive random access memory (RRAM), magnetoresistive random-access memory (MRAM), phase-change memory (PCM), conductive bridging random access memory (CBRAM), or the like. Other types of memory are within the scopes of various embodiments. In some embodiments, each memory cell MC is configured to store multiple bits. In at least one embodiment, each memory cell MC is configured to store one bit.

Figure 2B:
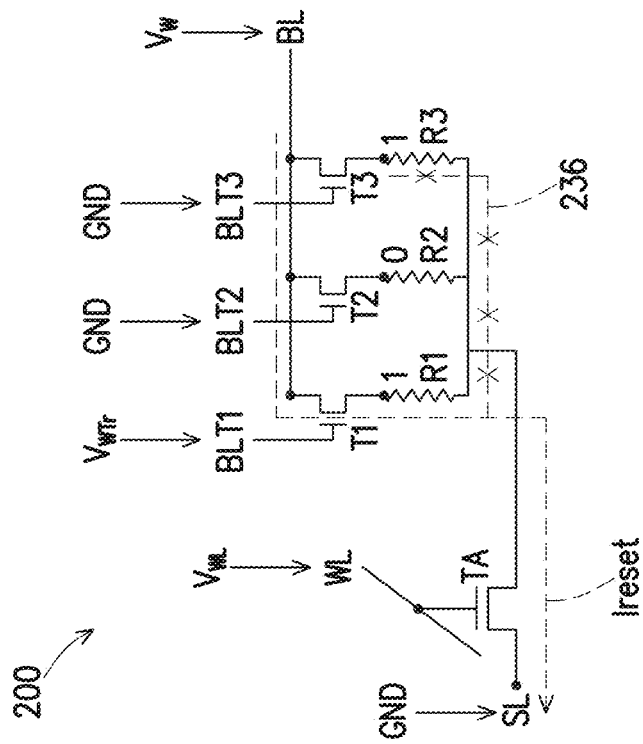
FIG. 2B is a schematic circuit diagram of the memory cell in an operation, in accordance with some embodiments.
Figure 2A:
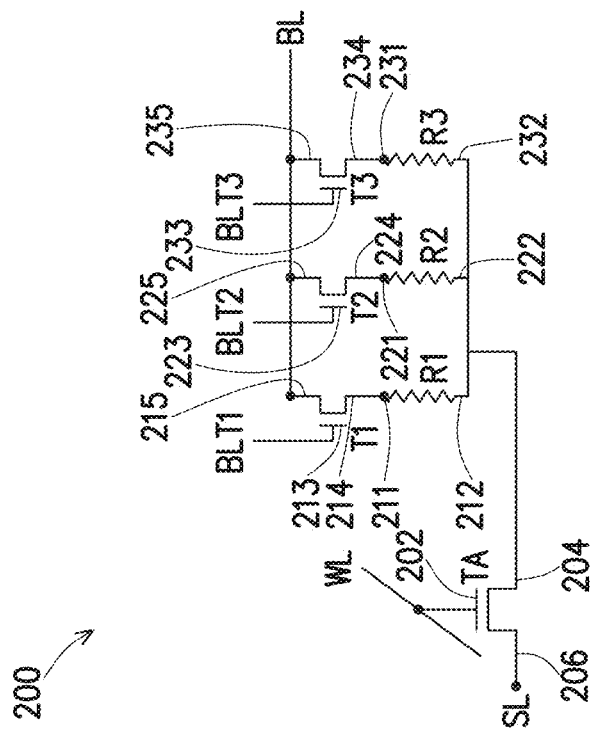
FIG. 2A is a schematic circuit diagram of a memory cell in accordance with some embodiments.

FIG. 2A is a schematic circuit diagram of a memory cell 200, in accordance with some embodiments. In at least one embodiment, the memory cell 200 corresponds to at least one of the memory cells MC in the memory device 100.

The memory cell 200 comprises a first transistor TA, a plurality of data storage elements R1, R2, R3, and a plurality of second transistors T1, T2, T3 corresponding to the plurality of data storage elements R1, R2, R3. In some embodiments, the first transistor TA is an access transistor, and the second transistors T1, T2, T3 are select transistors.

The access transistor TA has a gate 202, a first source/drain 204, and a second source/drain 206. The gate 202 of the access transistor TA is electrically coupled to a word line WL, and the second source/drain 206 is electrically coupled to a source line SL.

Each of the data storage elements R1, R2, R3 and the corresponding select transistor T1, T2, T3 are electrically coupled in series between the first source/drain 204 of the access transistor TA and a bit line BL. Specifically, each of the data storage elements R1, R2, R3 comprises a first terminal 211, 221, 231, and a second terminal 212, 222, 232. The first terminal is also referred to herein as "first electrode" and the second terminal is also referred to herein as "second electrode." Each of the select transistors T1, T2, T3 comprises a gate 213, 223, 233, a first source/drain 214, 224, 234, and a second source/drain 215, 225, 235. The first electrodes 211, 221, 231 of the data storage elements R1, R2, R3 are electrically coupled correspondingly to the first source/drains 214, 224, 234 of the select transistors T1, T2, T3. The second electrodes 212, 222, 232 of the data storage elements R1, R2, R3 are electrically coupled to the first source/drain 204 of the access transistor TA. The second source/drains 215, 225, 235 of the select transistors T1, T2, T3 are electrically coupled to the bit line BL. The gates 213, 223, 233 of the select transistors T1, T2, T3 are electrically coupled correspondingly to select bit lines BLT1, BLT2, BLT3.

The data storage elements R1, R2, R3 and the corresponding select transistors T1, T2, T3 together form a plurality of data storage circuits (not numbered in FIG. 2A) coupled in parallel between the bit line BL and the first source/drain 204 of the access transistor TA. For example, the data storage element R1 and the corresponding select transistor T1 together form a first data storage circuit, the data storage element R2 and the corresponding select transistor T2 together form a second data storage circuit, and the data storage element R3 and the corresponding select transistor T3 together form a third data storage circuit.

In at least one embodiment, the word line WL corresponds to at least one of the word lines WL in the memory device 100, the source line SL corresponds to at least one of the source lines SL in the memory device 100, and the bit line BL corresponds to at least one of the bit lines BL in the memory device 100. The select bit lines BLT1, BLT2, BLT3 are electrically coupled to a controller, such as the controller 102 in the memory device 100. In at least one embodiment, the source line SL is omitted, and the second source/drain 206 of the access transistor TA is coupled to a node of a predetermined voltage. Examples of a predetermined voltage include, but are not limited to, a ground voltage VSS, a positive power supply voltage VDD, or the like.

Examples of one or more of the access transistor TA and the select transistors T1, T2, T3 include, but are not limited to, thin-film transistors (TFT), metal oxide semiconductor field effect transistors (MOSFET), complementary metal oxide semiconductor (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In the example configuration described with respect to FIG. 2A, the access transistor TA and the select transistors T1, T2, T3 are NMOS transistors. Other configurations including one or more PMOS transistors instead of one or more of the NMOS transistors are within the scopes of various embodiments.

An example configuration of the data storage elements R1, R2, R3 in some embodiments described herein is an RRAM element, although other data storage or memory configurations are within the scopes of various embodiments. An RRAM element comprises a pair of electrodes, and a dielectric material sandwiched between the pair of electrodes. For example, in the data storage element R1, the pair of electrodes comprises the first electrode 211 and the second electrode 212. The dielectric material is not shown in FIG. 2A, and one or more examples of the dielectric material are described herein with respect to FIGS. 4A-4B.

The dielectric material is configured to be electrically switchable between a first state corresponding to a first logic value stored in the data storage element, and a second state corresponding to a second logic value stored in the data storage element. In some embodiments, a forming operation is performed to activate the dielectric material, for example, by applying a forming voltage between the pair of electrodes. The forming voltage is applied across the dielectric material and causes at least one conductive filament to be formed in the dielectric material and electrically couple the pair of electrodes. As a result, the activated dielectric material has a low resistance.

Once at least one conductive filament has been formed by a forming operation, it is possible to break the at least one conductive filament, by applying a reset voltage between the pair of electrodes in a reset operation. As a result, the reset dielectric material has a high resistance.

It is further possible to reform at least one conductive filament in the reset dielectric material, by applying a set voltage between the pair of electrodes in a set operation. As a result, the set dielectric material again has a low resistance. The low resistance of the dielectric material corresponds to a first state, also referred to as a low R state, of the dielectric material. The high resistance of the dielectric material corresponds to a second state, also referred to as a high R state, of the dielectric material. The low R state and high R state of the dielectric material are also referred to herein as the low R state and high R state of the corresponding data storage element.

In a read operation, a read voltage is applied between the pair of electrodes. When the dielectric material is in the low R state, a high read current is caused by the read voltage and is detected, e.g., by a sense amplifier, such as the SA 118. When the dielectric material is in the high R state, a low read current (or no read current) is caused by the read voltage and is detected, e.g., by the SA 118. A detected high read current corresponds to the low R state of the dielectric material and a first logic value, e.g., logic "1," stored in the data storage element. A detected low read current (or no read current) corresponds to the high R state of the dielectric material and a second logic value, e.g., logic "0," stored in the data storage element.

In at least one embodiment, the forming operation is performed once for each data storage element in a memory device before a very first use of the memory device to store data. After the forming operation has been performed for a data storage element, one or more reset operations and/or one or more set operations are performed to switch the dielectric material of the data storage element between the low R state and the high R state to correspondingly switch the datum stored in the data storage element between logic "1" and logic "0." The described structure, mechanism or configuration for switching the dielectric material of a data storage element between first and second states, i.e., by forming/setting at least one conductive filament and by braking the at least one conductive filament in the dielectric material is an example. Other structures, mechanisms or configurations for switching the dielectric material of a data storage element between different states corresponding to different logic values, are within the scopes of various embodiments.

In some situations, the reset voltage is a high voltage, although not as high as the forming voltage. In other approaches, such a high reset voltage applied to reset a selected data storage element potentially affects data stored in the other data storage elements, resulting in undesired reset disturb. A memory cell and/or a memory device in accordance with some embodiments make(s) it possible to avoid reset disturb as described herein.

FIG. 2B is a schematic circuit diagram of the memory cell 200 in a reset operation, in accordance with some embodiments. In some embodiments, one or more operations of the memory cell 200, including the reset operation, are controlled by a controller, such as the controller 102 of the memory device 100. For simplicity, reference numerals of various elements already described with respect to FIG. 2A are omitted in FIG. 2B.

In the example configuration in FIG. 2B, the data storage element R1 currently stores logic "1" corresponding to the low R state, the data storage element R2 currently stores logic "0" corresponding to the high R state, and the data storage element R3 currently stores logic "1" corresponding to the low R state. The data storage element R1 currently storing logic "1" is selected to be reset in the reset operation. The other data storage elements, i.e., the data storage element R2 and the data storage element R3, are not selected in the reset operation.

In the reset operation of the selected data storage element R1, the controller (not shown in FIG. 2B) is configured to turn ON the access transistor TA and the select transistor T1 corresponding to the selected data storage element R1, and turn OFF the select transistors T2, T3 corresponding to the non-selected data storage elements R2, R3. Specifically, the controller is configured to apply a turn-ON voltage $V_{WL}$ via the word line WL to the gate of the access transistor TA to turn ON the access transistor TA, and apply a further turn-ON voltage $V_{WT1}$ via the corresponding select bit line BLT1 to the gate of the select transistor T1 corresponding to the selected data storage element R1. The controller is further configured to apply a turn-OFF voltage via the corresponding select bit lines BLT2, BLT3 to the gates of the other select transistors T2, T3 corresponding to the non-selected data storage elements R2, R3. In the example configuration in FIG. 2B, the turn-OFF voltage is a ground voltage schematically illustrated in FIG. 2B with the label "GND." While the access transistor TA and the select transistor T1 corresponding to the selected data storage element R1 are turned ON and the other select transistors T2, T3 are turned OFF, the controller is further configured to apply a reset voltage $V_W$ to the bit line BL. In at least one embodiment, the controller is further configured to apply the ground voltage to the source line SL. In one or more embodiments, the source line SL is grounded independently of control by the controller.

While the access transistor TA and the select transistor T1 are turned ON, the reset voltage $V_W$ on the bit line BL and the ground voltage on the source line SL cause a reset current Ireset to flow from the bit line BL, through the data storage element R1, to the ground at the source line SL. The resistance of the dielectric material in the data storage element R1, even in the low R state corresponding to logic "1," is still much higher than resistances of conductive patterns and the turned ON transistors TA, T1 that electrically couple the data storage element R1 to the bit line BL and the source line SL. As a result, a substantial portion of the reset voltage $V_W$ is applied across the dielectric material of the data storage element R1, and resets the dielectric material of the data storage element R1 from the low R state to the high R state. In other words, the datum stored in the data storage element R1 is switched from logic "1" to logic "0."

In the reset operation of the selected data storage element R1, because the select transistors T2, T3 corresponding to the non-selected data storage elements R2, R3 are turned OFF, there is no current path through the non-selected data storage elements R2, R3 even if one or more of the non-selected data storage elements are in the low R state. For example, even though the non-selected data storage element R3 is in the low R state, because the corresponding select transistor T3 is turned OFF, there is no current path through the non-selected data storage element R3, as schematically illustrated at 236 in FIG. 2B. As a result, data stored in the non-selected data storage elements R2, R3 are not affected by the high reset voltage $V_W$ applied to the bit line BL in the reset operation of the selected data storage element R1. In other words, reset disturb is avoidable in one or more embodiments. This is an improvements over other approaches in which reset disturb is a concern due to a potential current path through a non-selected data storage element in the low R state. In some embodiments, other advantages of the memory cell 200 and/or a memory device comprising the memory cell 200 include, but are not limited to, simple and efficient three-dimensional (3D) stack structure, compatibility with BEOL processes, increased memory density, as described herein. In some embodiments, set disturb is avoidable.

In some embodiments, one or more other operations of the memory cell 200 are performed in a similar manner to the described reset operation. For example, in a set operation of the selected data storage element R1, the controller is configured to turn ON the access transistor TA and the select transistor T1 corresponding to the selected data storage element R1, turn OFF the select transistors T2, T3 corresponding to the non-selected data storage elements R2, R3, and apply a set voltage to the bit line BL and the ground voltage to the source line SL. For another example, in a read operation of the selected data storage element R1, the controller is configured to turn ON the access transistor TA and the select transistor T1 corresponding to the selected data storage element R1, turn OFF the select transistors T2, T3 corresponding to the non-selected data storage elements R2, R3, and apply a read voltage to the bit line BL and the ground voltage to the source line SL. The read voltage is smaller than the reset voltage and the set voltage. In a forming operation, the controller is configured to turn ON the access transistor TA and one or more or all of the select transistors T1, T2, T3, and apply a forming voltage to the bit line BL and the ground voltage to the source line SL. The forming voltage is higher than the reset voltage and the set voltage.

The above described reset operation is performed under control of the controller in a unipolar mode, in which a polarity of the reset voltage is the same as a polarity of the forming voltage. In some embodiments, the controller is configured to perform a reset operation in a bipolar mode, in which the polarity of the reset voltage is opposite to the polarity of the forming voltage. For example, in a reset operation of the selected data storage element R1 in the bipolar mode, the controller is configured to turn ON the access transistor TA and the select transistor T1 corresponding to the selected data storage element R1, and turn OFF the select transistors T2, T3 corresponding to the non-selected data storage elements R2, R3, similarly to the unipolar mode. However, the reset voltage in the bipolar mode is reversed in polarity compared to the unipolar mode. Specifically, the controller is configured to apply the reset voltage $V_W$ to the source line SL, and apply the ground voltage to the bit line BL. In at least one embodiment, reset disturb is avoidable in the bipolar mode.

In the example configuration in FIGS. 2A-2B, there are three data storage elements R1, R2, R3 and three corresponding select transistors T1, T2, T3 in the memory cell 200. The described numbers of data storage elements and corresponding select transistors in a memory cell are examples. Other configurations are within the scopes of various embodiments. For example, in at least one embodiment, a memory cell comprises, besides an access transistor, n data storage elements and n corresponding select transistors, where n is a natural number greater than one. In other words, the memory cell in one or more embodiments has a (n+1)-transistor-n-resistor configuration, also referred to herein as (n+1)TnR. The example configuration in FIGS. 2A-2B is a 4T3R configuration, where n is three. In some embodiments, the number n is selected based on one or more design considerations. An example design consideration is a device pitch of the access transistor, as described herein.

Figure 3:
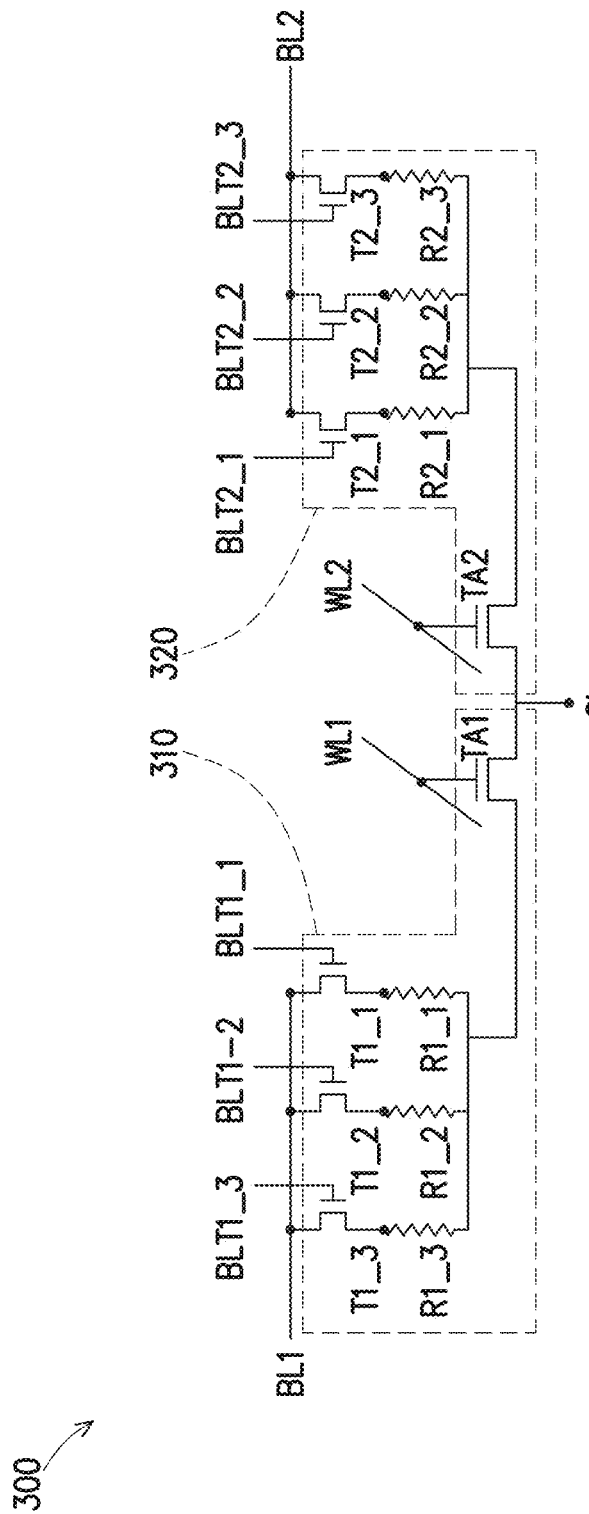
FIG. 3 is a schematic circuit diagram of a memory device, in accordance with some embodiments.

FIG. 3 is a schematic circuit diagram of a memory device 300, in accordance with some embodiments. The memory device 300 comprises memory cells 310, 320 which have the 4T3R configuration described with respect to FIGS. 2A-2B. Other configurations in which the memory cells 310, 320 have a (n+1)TnR configuration, where n is other than three, are within the scopes of various embodiments.

In the example configuration in FIG. 3, the memory cell 310 comprises an access transistor TA1, a plurality of data storage elements R1_1, R1_2, R1_3, and a plurality of corresponding select transistors T1_1, T1_2, T1_3 which are electrically coupled to a word line WL1, a bit line BL1, a source line SL and a plurality of select bit lines BLT1_1, BLT1_2, BLT1_3 similarly to a manner in which the access transistor TA, the data storage elements R1, R2, R3, and the select transistors T1, T2, T3 of the memory cell 200 are electrically coupled to the word line WL, the bit line BL, the source line SL and the select bit lines BLT1, BLT2, BLT3. The memory cell 320 comprises an access transistor TA2, a plurality of data storage elements R2_1, R2_2, R2_3, and a plurality of corresponding select transistors T2_1, T2_2, T2_3 which are electrically coupled to a word line WL2, a bit line BL2, the source line SL and a plurality of select bit lines BLT2_1, BLT2_2, BLT2_3 similarly to a manner in which the access transistor TA, the data storage elements R1, R2, R3, and the select transistors T1, T2, T3 of the memory cell 200 are electrically coupled to the word line WL, the bit line BL, the source line SL and the select bit lines BLT1, BLT2, BLT3.

In the memory device 300, the second source/drain of the access transistor TA1 and the second source/drain of the access transistor TA2 are electrically coupled to the common source line SL. In at least one embodiment, the second source/drain of the access transistor TA1 is the second source/drain of the access transistor TA2. In other words, the access transistor TA1 and the access transistor TA2 share a common source/drain. In at least one embodiment, one or more advantages described herein are achievable in the memory device 300.

Figure 4A:
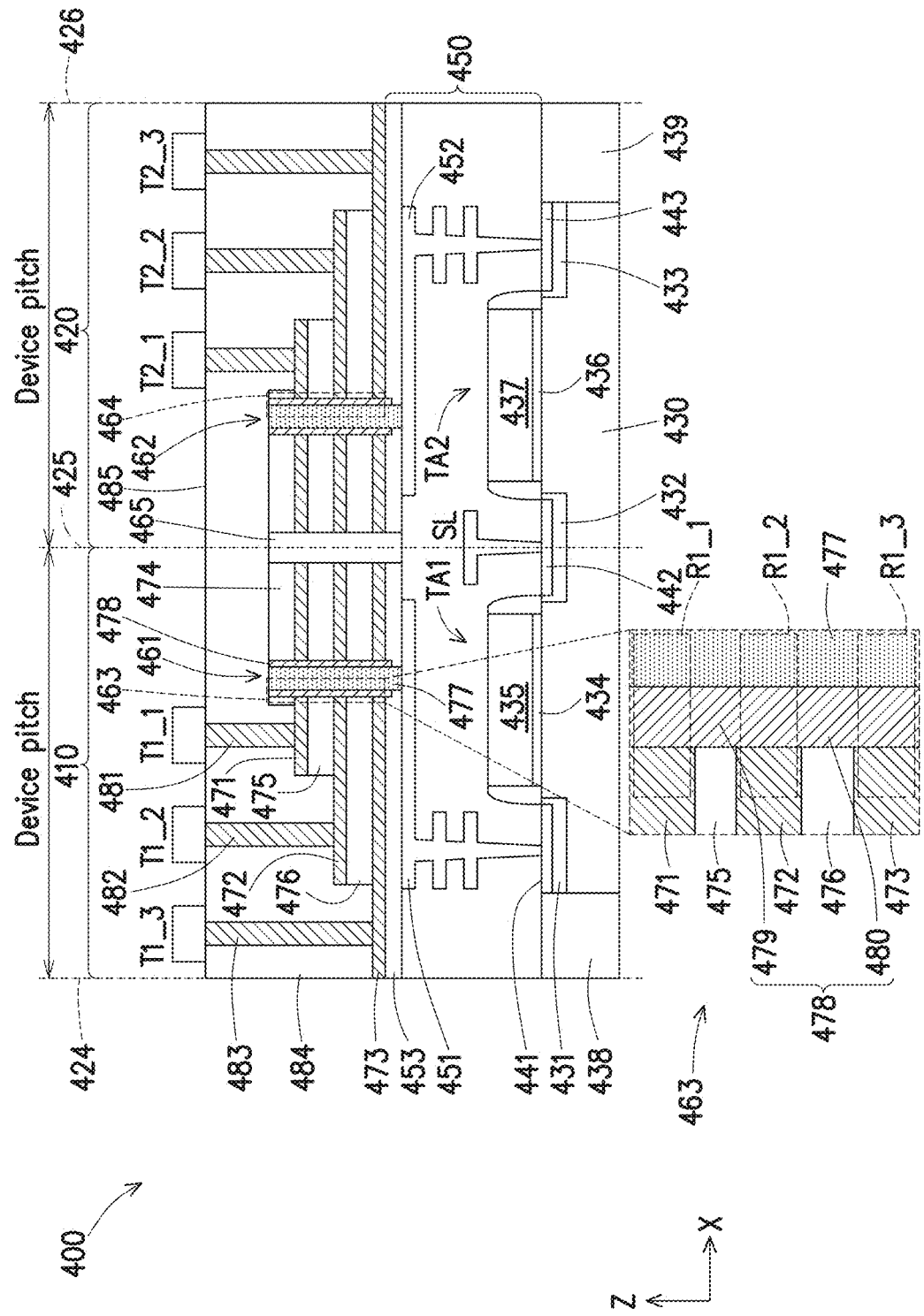
FIG. 4A is a schematic cross-sectional view of an IC device in accordance with some embodiments.

FIG. 4A is a schematic cross-sectional view of an IC device 400, in accordance with some embodiments.

The IC device 400 comprises a first region 410 and a second region 420 arranged side by side in a first direction, e.g., the X direction. The first region 410 is defined between a first border line 424 and a center line 425. The second region 420 is defined between the center line 425 and a second border line 426. A distance in the X direction between the first border line 424 and the center line 425 is equal to a distance in the X direction between the center line 425 and the second border line 426, and is referred to herein and illustrated in FIG. 4A as a device pitch. In at least one embodiment, the first border line 424 and the second border line 426 correspond to border lines of a standard memory cell which is stored in a standard cell library and based on which the IC device 400 is manufactured. In one or more embodiments, the first border line 424 and the center line 425 correspond to border lines of one standard memory cell, and the center line 425 and the second border line 426 correspond to border lines of another standard memory cell. For example, the first region 410 corresponds to the memory cell 310 of the memory device 300, and the second region 420 corresponds to the memory cell 320 of the memory device 300. The first region 410 and the second region 420 are similarly configured. In at least one embodiment, the first region 410 and the second region 420 are symmetrical to each other across the center line 425. A detailed description of features of the first region 410 is given herein, and a detailed description of similar features of the second region 420 is omitted, where appropriate, for simplicity.

The IC device 400 comprises a substrate 430 having thereon at least one access transistor. For example, the access transistor TA1 is arranged over the substrate 430 in the first region 410, and the access transistor TA2 is arranged over the substrate 430 in the second region 420. Each of the access transistor TA1 and the access transistor TA2 comprises a gate structure and source/drains. In some embodiments, the substrate 430 is a semiconductor substrate, and N-type and/or P-type dopants are added to the substrate 430 to form source/drains 431, 432, 433 arranged at a spacing from each other along the X direction. In the example configuration in FIG. 4A, the access transistor TA1 comprises the source/drains 431, 432, whereas the access transistor TA2 comprises the source/drains 432, 433. In other words, the access transistor TA1 and the select transistor T2 share the common source/drain 432. The center line 425 bisects a width of the common source/drain 432 in the X direction. The gate structure of the access transistor TA1 comprises a stack of a gate dielectric 434 and a gate 435. The gate structure of the access transistor TA2 comprises a stack of a gate dielectric 436 and a gate 437. Example materials of the gate dielectrics 434, 436 include $HfO_2$, $ZrO_2$, or the like. Example materials of the gates 435, 437 include polysilicon, metal, or the like. In the example configuration in FIG. 4A, spacers (not numbered) are arranged on opposite sides of the gate structures of the access transistor TA1 and the access transistor TA2.

The IC device 400 further comprises isolation structures 438, 439 in the substrate 430 for isolating the access transistor TA1 and the access transistor TA2 from other, adjacent transistors or logic elements. The access transistor TA1 and the access transistor TA2 are arranged in the X direction between the isolation structures 438, 439. In one or more embodiments, the IC device 400 further comprises another instance of the first region 410 placed in abutment with the second region 420 along the second border line 426, and the second border line 426 becomes a center line which bisects a width of a joined isolation structure comprising the isolation structure 439 of the second region 420 and an isolation structure (corresponding to the isolation structure 438) of the further instance of the first region 410. Similarly, in one or more embodiments, the IC device 400 further comprises another instance of the second region 420 placed in abutment with the first region 410 along the first border line 424, and the first border line 424 becomes a center line which bisects a width of a joined isolation structure comprising the isolation structure 438 of the first region 410 and an isolation structure (corresponding to the isolation structure 439) of the further instance of the second region 420. In at least one embodiment, the device pitch is the distance in the X direction between the center line 425 of the common source/drain 432 and the center line 426 (or 424) of a joined isolation structure.

The IC device 400 further comprises source/drain contact structures 441, 442, 443 correspondingly over and in electrical contact with the source/drains 431, 432, 433. In at least one embodiment, the IC device 400 further comprises gate contact structures (not shown) correspondingly over and in electrical contact with the gates 435, 437.

The IC device 400 further comprises an interconnect structure 450 over the substrate 430. The interconnect structure 450 comprise a plurality of metal layers and a plurality of via layers arranged alternatingly in a thickness direction, i.e., the Z direction, of the substrate 430. Examples of metal layers in the interconnect structure 450 comprise an M0 layer, an M1 layer, or the like. Examples of via layers in the interconnect structure 450 comprise a V0 layer, a V1 layer, or the like. The M0 layer is the lowest metal layer in the interconnect structure 450. The V0 layer is the lowest via layer in the interconnect structure 450, and electrically couples the M0 layer and the M1 layer. The interconnect structure 450 further comprises various interlayer dielectric (ILD) layers in which the metal layers and via layers are embedded. The metal layers and via layers of the interconnect structure 450 are configured to electrically couple various elements or circuits of the IC device 400 with each other, and with external circuitry. In the example configuration in FIG. 4A, the interconnect structure 450 comprises the source line SL electrically coupled to the source/drain 432, a conductive pattern 451 electrically coupled to the source/drain 431 of the access transistor TA1, a conductive pattern 452 electrically coupled to the source/drain 433 of the access transistor TA2. In at least one embodiment, the interconnect structure 450 further comprises the word lines WL1, WL2 (not shown in FIG. 4A) electrically coupled correspondingly to the gates 435, 437. The interconnect structure 450 further comprises an ILD layer 453 over the conductive patterns 451, 452.

The IC device 400 further comprises at least one metal-insulator-metal (MIM) structure over the interconnect structure 450. For example, an MIM structure 461 is arranged over the interconnect structure 450 in the first region 410, and an MIM structure 462 is arranged over the interconnect structure 450 in the second region 420. Each of the MIM structures 461, 462 is arranged as a via structure (not numbered) extending through a multilayer structure (not numbered) comprising a plurality of electrode layers 471, 472, 473 and ILD layers 474, 475, 476 which are stacked alternatingly in the Z direction over the interconnect structure 450. The via structure of the MIM structure 461 comprises a conductor 477, and a dielectric layer 478 between the conductor 477 and the multilayer structure. The via structure of the MIM structures 461, 462 is similarly configured. The MIM structure 461 is described in detail herein, with reference to an enlarged view of a region 463 of the MIM structure 461 schematically illustrated in FIG. 4A. A corresponding region 464 of the MIM structure 462 is similarly configured. In at least one embodiment, the region 464 of the MIM structure 462 is a mirror image of the region 463 of the MIM structure 461 across the center line 425. The IC device 400 further comprises an isolation structure 465 electrically isolating the MIM structures 461, 462 from each other.

As best seen in the enlarged view of the region 463, the MIM structure 461 comprises a plurality of data storage elements R1_1, R1_2, R1_3 stacked on top each other in the thickness direction of the substrate 430, i.e., in the Z direction. In other words, the data storage elements R1_1, R1_2, R1_3 are arranged at different heights over the substrate 430. Each of the data storage elements R1_1, R1_2, R1_3 comprises a first electrode defined by one of the electrode layers 471, 472, 473, a second electrode defined by the conductor 477, and a dielectric material sandwiched between the first electrode and the second electrode. For example, the data storage element R1_1 comprises a first electrode defined by the electrode layer 471, a second electrode defined by the conductor 477, and a dielectric material defined by a portion of the dielectric layer 478 sandwiched in the X direction between the electrode layer 471 and the conductor 477. The data storage element R1_2 comprises a first electrode defined by the electrode layer 472, a second electrode defined by the conductor 477, and a dielectric material defined by a portion of the dielectric layer 478 sandwiched in the X direction between the electrode layer 472 and the conductor 477. The data storage element R1_3 comprises a first electrode defined by the electrode layer 473, a second electrode defined by the conductor 477, and a dielectric material defined by a portion of the dielectric layer 478 sandwiched in the X direction between the electrode layer 473 and the conductor 477. The dielectric layer 478 further comprises, in the Z direction, an intervening portion 479 between the data storage elements R1_1, R1_2, and an intervening portion 480 between the data storage elements R1_2, R1_3. The intervening portion 479 of the dielectric layer 478 is sandwiched in the X direction between the ILD layer 475 and the conductor 477, and the intervening portion 480 of the dielectric layer 478 is sandwiched in the X direction between the ILD layer 476 and the conductor 477. In a forming operation, reset operation or set operation, a corresponding forming voltage, reset voltage or set voltage is applied to switch the dielectric materials in the data storage elements R1_1, R1_2, R1_3 between the low R state and the high R state as described herein. However, the intervening portions 479, 480 of the dielectric layer 478, being sandwiched between the ILD layers 475, 476 and the conductor 477, are not affected by the forming voltage, reset voltage or set voltage, and remain electrically insulating.

The conductor 477, which defines the second electrodes of the data storage elements R1_1, R1_2, R1_3, extends in the Z direction through the ILD layer 453 to be electrically coupled to the conductive pattern 451, and then to the source/drain 431 of the access transistor TAL A corresponding conductor in the MIM structure 462 extends in the Z direction through the ILD layer 453 to be electrically coupled to the conductive pattern 452, and then to the source/drain 433 of the access transistor TA2.

Example materials of one or more of the electrode layers 471, 472, 473 defining the first electrodes (also referred to as top electrodes) of the data storage elements include, but are not limited to, Al, Ti, TiN, TaN, Co, Ag, Au, Cu, Ni, Cr, Hf, Ru, W, Pt, or the like. Example materials of the conductor 477 defining the second electrodes (also referred to as bottom electrodes) of the data storage elements include, but are not limited to, Al, Ti, TiN, TaN, Co, Ag, Au, Cu, Ni, Cr, Hf, Ru, W, Pt, or the like. Example materials of the dielectric layer 478 defining the dielectric material in the data storage elements include, but are not limited to, $HfO_2$, $Hf_{1-x}Zr_xO_2$, $ZrO_2$, $TiO_2$, NiO, $TaO_x$, $Cu_2O$, $Nb_2O_5$, $Al_2O_3$, or the like.

The IC device 400 further comprises a plurality of select transistors over the data storage elements, and electrically coupled correspondingly to the data storage elements. For example, a dielectric layer 484 is arranged over the MIM structures 461, 462, a plurality of select transistors T1_1, T1_2, T1_3 is arranged in the first region 410 over a top surface 485 of the dielectric layer 484, and a plurality of select transistors T2_1, T2_2, T2_3 is arranged in the second region 420 over the top surface 485 of the dielectric layer 484. The select transistors T1_1, T1_2, T1_3, T2_1, T2_2, T2_3 are schematically illustrated in FIG. 4A. In the first region 410, via structures 481, 482, 483 are formed in the dielectric layer 484 to electrically couple first source/drains of the select transistors T1_1, T1_2, T1_3 correspondingly to the electrode layers 471, 472, 473 which correspondingly define the first electrodes of the data storage elements R1_1, R1_2, R1_3. Similar via structures (not numbered) are formed in the second region 420.

In the example configuration in FIG. 4A, to provide electrical contact with the corresponding via structures 481, 482, 483, the electrode layers 471, 472, 473, which are arranged at different levels or heights in the Z direction, are configured to form a stepwise structure. For example, the electrode layer 471 which is at the highest level among the electrode layers 471, 472, 473 has a smallest dimension in the X direction among the electrode layers 471, 472, 473. The electrode layer 472 which is at a middle level has a middle dimension in the X direction. The electrode layer 473 which is at the lowest level among the electrode layers 471, 472, 473 has the greatest dimension in the X direction among the electrode layers 471, 472, 473. The corresponding via structures 481, 482, 483 have different heights or depths in the Z direction. For example, among the via structures 481, 482, 483, the via structure 481 has the smallest height, the via structure 482 has a middle height, and the via structure 483 has the greatest height. The second region 420 comprises a similar stepwise structure.

By way of the interconnect structure 450 and the via structures 481, 482, 483, each of the data storage elements R1_1, R1_2, R1_3 in the first region 410 is electrically coupled in series between the first source/drain 431 of the access transistor TA1 and the first source/drain of a corresponding select transistor T1_1, T1_2, T1_3. In the second region 420, the data storage elements in the MIM structure 462 are electrically coupled in series between the first source/drain 433 of the access transistor TA2 and the first source/drain of a corresponding select transistor T2_1, T2_2, T2_3 in a similar manner.

In some embodiments, the data storage elements, such as the data storage elements R1_1, R1_2, R1_3, are arranged in a simple and efficient 3D stack in the form of an MIM structure, such as the MIM structure 461. In at least one embodiment, the chip area occupied by the MIM structure is not changed even when the number n of data storage elements included in the MIM structure is increased. As a result, it is possible to increase or improve the memory density of the IC device 400 over a given chip area, in accordance with some embodiments.

However, the number n of data storage elements in an MIM structure of a memory cell corresponds to the number n of select transistors in the memory cell. As the number n of data storage elements included in the MIM structure is increased, the number n of select transistors in the memory cell is also increased. In the example configuration in FIG. 4A, all select transistors T1_1, T1_2, T1_3 of the memory cell 310 are arranged in the first region 410 corresponding to the device pitch between the first border line 424 and the center line 425. In at least one embodiment, this arrangement makes it possible to arrange various memory cells in abutment to form a memory array, such as the memory array 104. To physically fit n select transistors in a region corresponding to the device pitch of the access transistor, dimensions of each select transistor and the device pitch of the access transistor are design considerations. Such design considerations define a maximum number of select transistors that can be fit over the region corresponding to the device pitch, i.e., the maximum number of data storage elements that can be included in the memory cell.

Figure 4B:
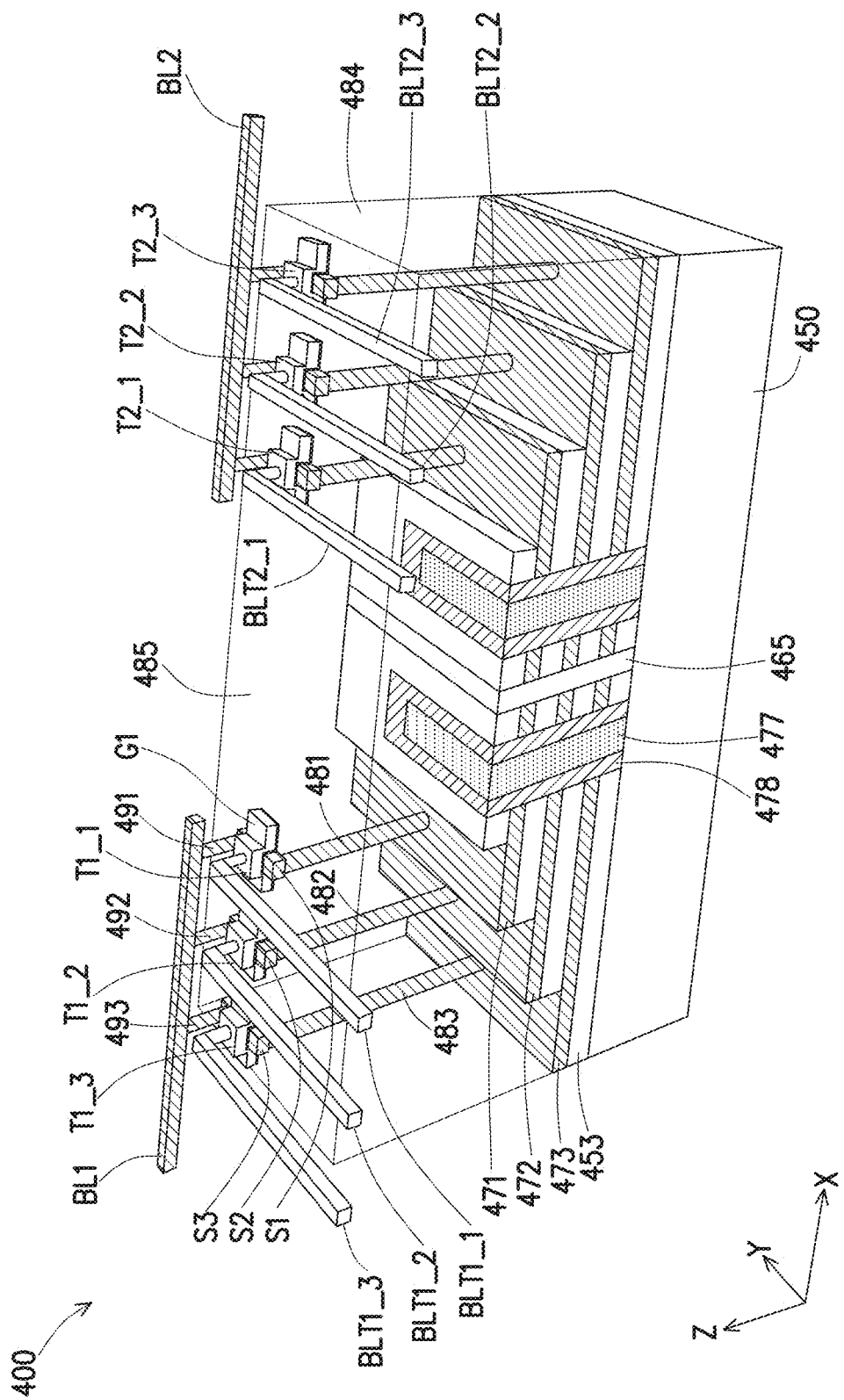
FIG. 4B is a schematic perspective view of the IC device in accordance with some embodiments.

FIG. 4B is a schematic perspective view of the IC device 400, in accordance with some embodiments. Compared to FIG. 4A, FIG. 4B illustrates the select transistors in more details, and also shows how various bit lines and select bit lines are coupled to the select transistors.

In the example configuration in FIG. 4B, the select transistors T1_1, T1_2, T1_3, T2_1, T2_2, T2_3 are arranged over the top surface 485 of the dielectric layer 484. Each of the select transistors comprises a source/drain region extending in a second direction, e.g., the Y direction, transverse to the X direction. Each of the select transistors further comprises a gate extending over the source/drain region in the X direction.

Figure 4C:
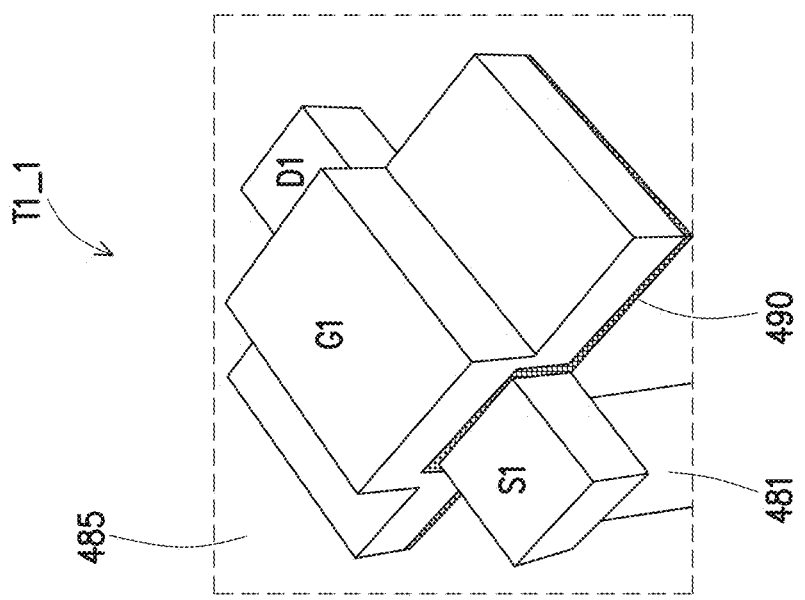
FIG. 4C is an enlarged schematic perspective view of a part of the IC device in accordance with some embodiments.

FIG. 4C is an enlarged schematic perspective view of a select transistor T1_1 of the IC device 400 in FIG. 4B, in accordance with some embodiments. For simplicity, connections from the select transistor T1_1 to the corresponding bit line BL1 and select bit line BLT1_1 are omitted in FIG. 4C. As shown in FIG. 4C, the select transistor T1_1 comprises a source/drain region or active channel layer arranged over the top surface 485, and extending in the Y direction. The source/drain region comprises a source S1 and a drain D1. The select transistor T1_1 further comprises a gate G1 extending over the source/drain region in the X direction. A gate dielectric 490 is arranged between the source/drain region and the gate G1. The source S1 is arranged over a top end (not shown) of the corresponding via structure 481, and is electrically coupled to the via structure 481. The drain D1 is electrically coupled to the corresponding bit line BL1, and the gate G1 is electrically coupled to the corresponding select bit line BLT1_1, as described herein.

Returning to FIG. 4B, sources S2, S3 of the select transistors T1_2, T1_3 are arranged over top ends (not shown) of the corresponding via structures 482, 483, and are electrically coupled to the via structures 482, 483. The drains of the select transistors T1_1, T1_2, T1_3 are electrically coupled to the bit line BL1 by corresponding via structures 491, 492, 493. The gates of the select transistors T1_1, T1_2, T1_3 are electrically coupled to the corresponding select bit lines BLT1_1, BLT1_2, BLT1_3 by corresponding via structures (not numbered). The select transistors T2_1, T2_2, T2_3 are electrically coupled to the bit line BL2 and the select bit lines BLT2_1, BLT2_2, BLT2_3 in similar manners.

In the example configuration in FIG. 4B, the bit lines BL1, BL2 extend in the X direction, whereas the select bit lines BLT1_1, BLT1_2, BLT1_3, BLT2_1, BLT2_2, BLT2_3 extend in the Y direction. In at least one embodiment, the bit lines BL1, BL2 are in one metal layer, and the select bit lines BLT1_1, BLT1_2, BLT1_3, BLT2_1, BLT2_2, BLT2_3 are in a different metal layer. The conductor 477 is elongated in the Y direction, i.e., the conductor 477 has a greater dimension in the Y direction than in the X direction. In other words, the via in which the conductor 477 is deposited has a shape of a trench elongated in the Y direction. This configuration of the conductor 477 is an example. Other configurations are within the scopes of various embodiments. In at least one embodiment, one or more advantages described herein are achievable in the IC device 400.

Figure 4D:
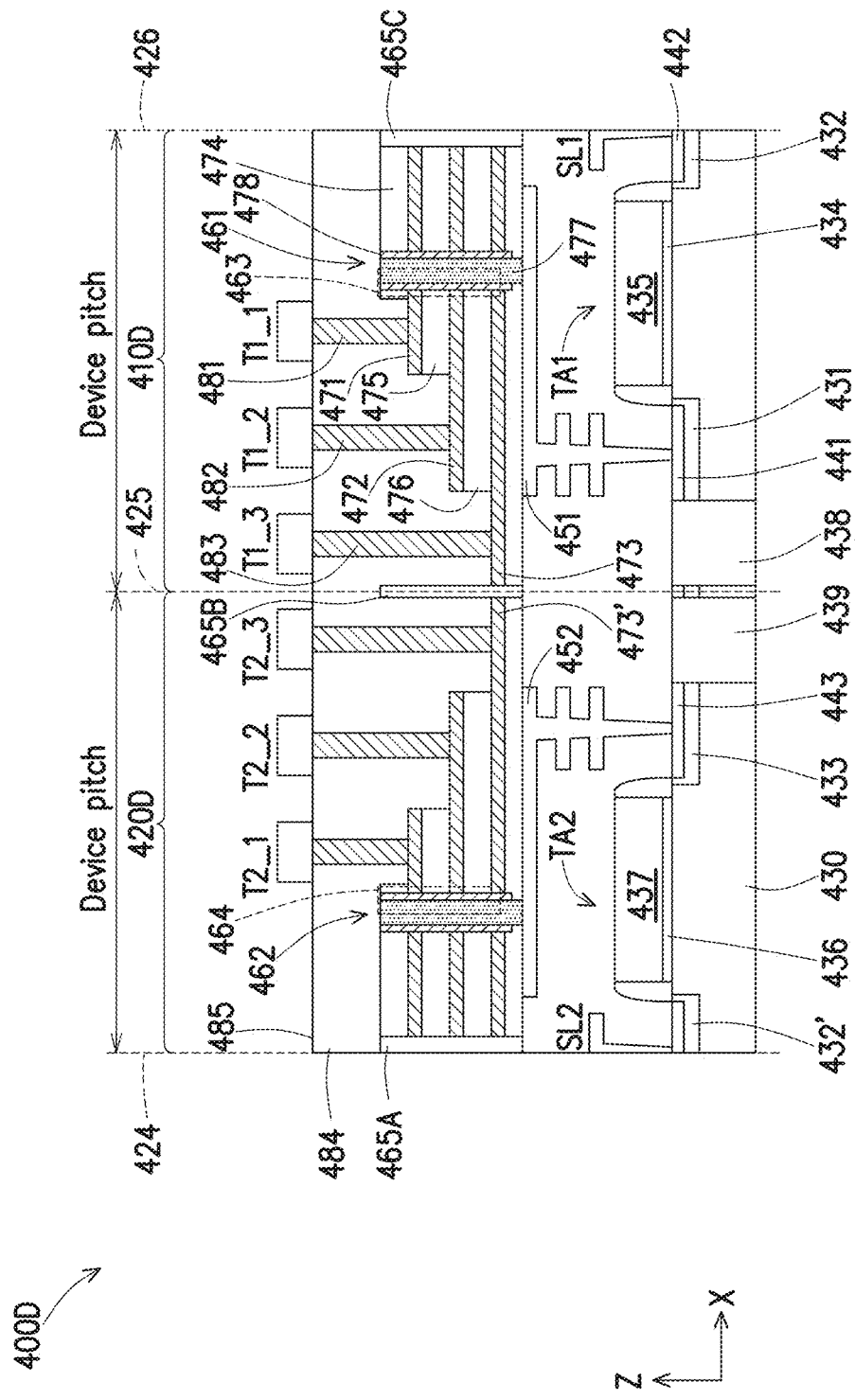
FIG. 4D is a schematic cross-sectional view of an IC device in accordance with some embodiments.

FIG. 4D is a schematic cross-sectional view of an IC device 400D in accordance with some embodiments. Corresponding elements in IC device 400 and IC device 400D are designated by the same reference numerals. Compared to the IC device 400 where the MIM structures 461, 462 are arranged in the X direction between the stepwise structure of the electrode layers 471, 472, 473 in the first region 410 and the corresponding stepwise structure in the second region 420, the IC device 400D comprises a reversed arrangement in which stepwise structures are arranged between MIM structures.

The IC device 400D comprises a first region 410D and a second region 420D. The first region 410D has a configuration corresponding to the configuration of the first region 410, and the second region 420D has a configuration corresponding to the configuration of the second region 420. Contrary to the example configuration in FIG. 4 where the first region 410 is arranged on the left and the second region 420 is arranged on the right, in the example configuration in FIG. 4D, the first region 410D is arranged on the right and the second region 420D is arranged on the left. As a result, the stepwise structure of the electrode layers 471, 472, 473 in the first region 410D and the corresponding stepwise structure in the second region 420D are arranged in the X direction between the MIM structures 461, 462. The IC device 400D further comprises isolation structures 465A, 465B, 465C. The isolation structure 465B electrically isolates the electrode layer 473 in the first region 410D from a corresponding electrode layer 473' in the second region 420D. The isolation structures 465A, 465C electrically isolate the MIM structures 461, 462 from other circuitry in the IC device 400D. In at least one embodiment, one or more of the isolation structures 465A, 465C are omitted. In the first region 410D, a first source line SL1 is electrically coupled to the source/drain 432 of the access transistor TA1. In the second region 420D, a second source line SL2 is electrically coupled to the source/drain 432' of the access transistor TA2. In at least one embodiment, the first region 410D and the second region 420D are symmetrical to each other across the center line 425. In at least one embodiment, one or more advantages described herein are achievable in the IC device 400D.

Figure 4E:
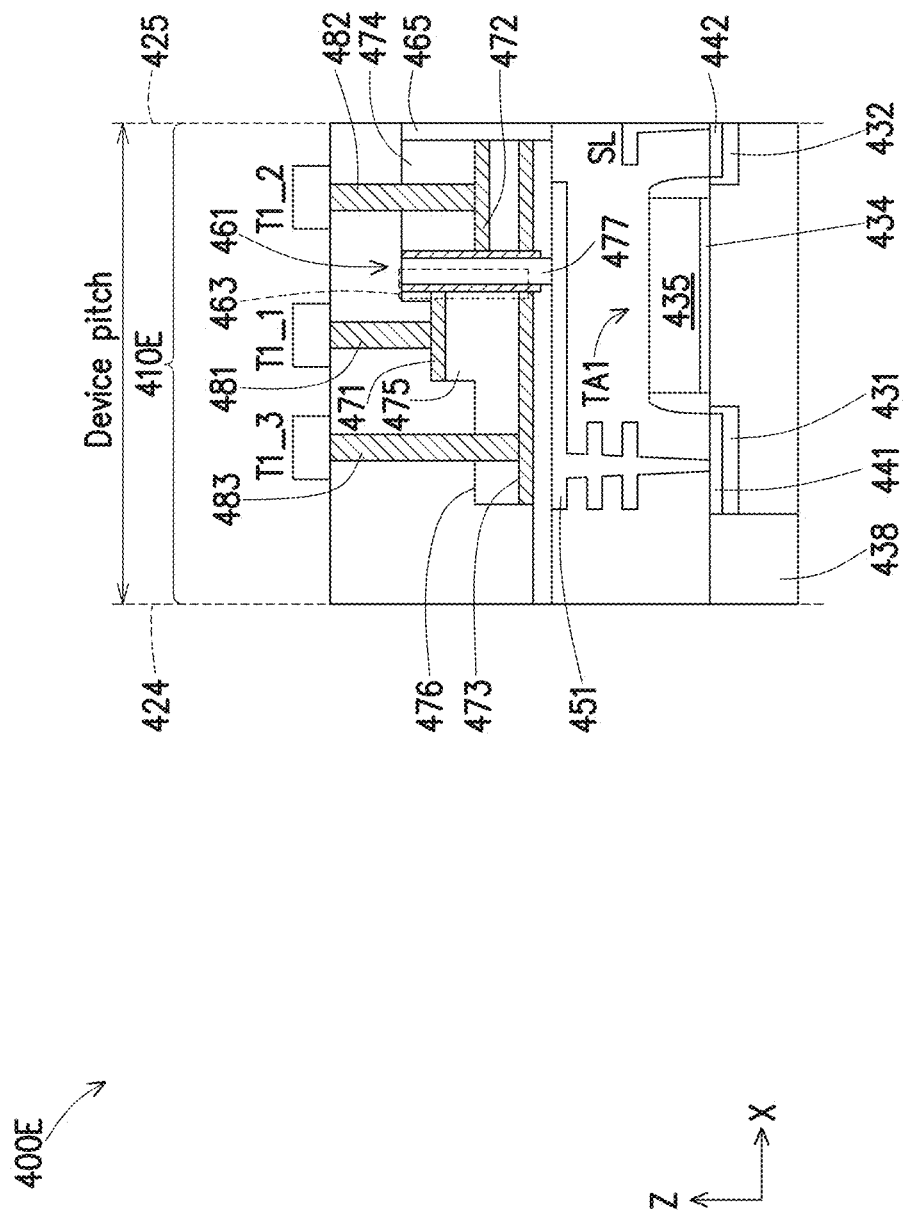
FIG. 4E is a schematic cross-sectional view of an IC device in accordance with some embodiments.

FIG. 4E is a schematic cross-sectional view of an IC device 400E in accordance with some embodiments. Corresponding elements in IC device 400 and IC device 400E are designated by the same reference numerals. Compared to the IC device 400 where, in each of the first region 410 and the second region 420, the select transistors T1_1, T1_2, T1_3 are arranged on the same side of the MIM structure 461 in the X direction, the IC device 400E comprises a reversed arrangement in which the select transistors are arranged on opposite sides of the corresponding MIM structure in the X direction.

The IC device 400E comprises a first region 410E. The first region 410E has a configuration corresponding to the configuration of the first region 410, except that the select transistors T1_1, T1_3 are arranged on one side (e.g., on the left side) of the MIM structure 461 whereas the select transistor T1_2 is arranged on the other side (e.g., on the right side) of the MIM structure 461 in the X direction. The described arrangement is an example configuration. In another example configuration (not shown), the select transistors T1_1, T1_2 are arranged on one side of the MIM structure 461 whereas the select transistor T1_3 is arranged on the other side of the MIM structure 461 in the X direction. In a further example configuration (not shown), the select transistor T1_1 is arranged on one side of the MIM structure 461 whereas the select transistors T1_2, T1_3 are arranged on the other side of the MIM structure 461 in the X direction. Other configurations are within the scopes of various embodiments. In some embodiments, the IC device 400E further comprises a second region (not shown) which is symmetrical to the first region 410E across the center line 425. In one or more embodiments, the second region of the IC device 400E is arranged on the right side of the first region 410E in a manner to similar to the second region 420 arranged on the right side of the first region 410 in FIG. 4A. In at least one embodiment, the second region of the IC device 400E is arranged on the left side of the first region 410E in a manner to similar to the second region 420D arranged on the left side of the first region 410D in FIG. 4D. In at least one embodiment, one or more advantages described herein are achievable in the IC device 400E.

Figure 5:
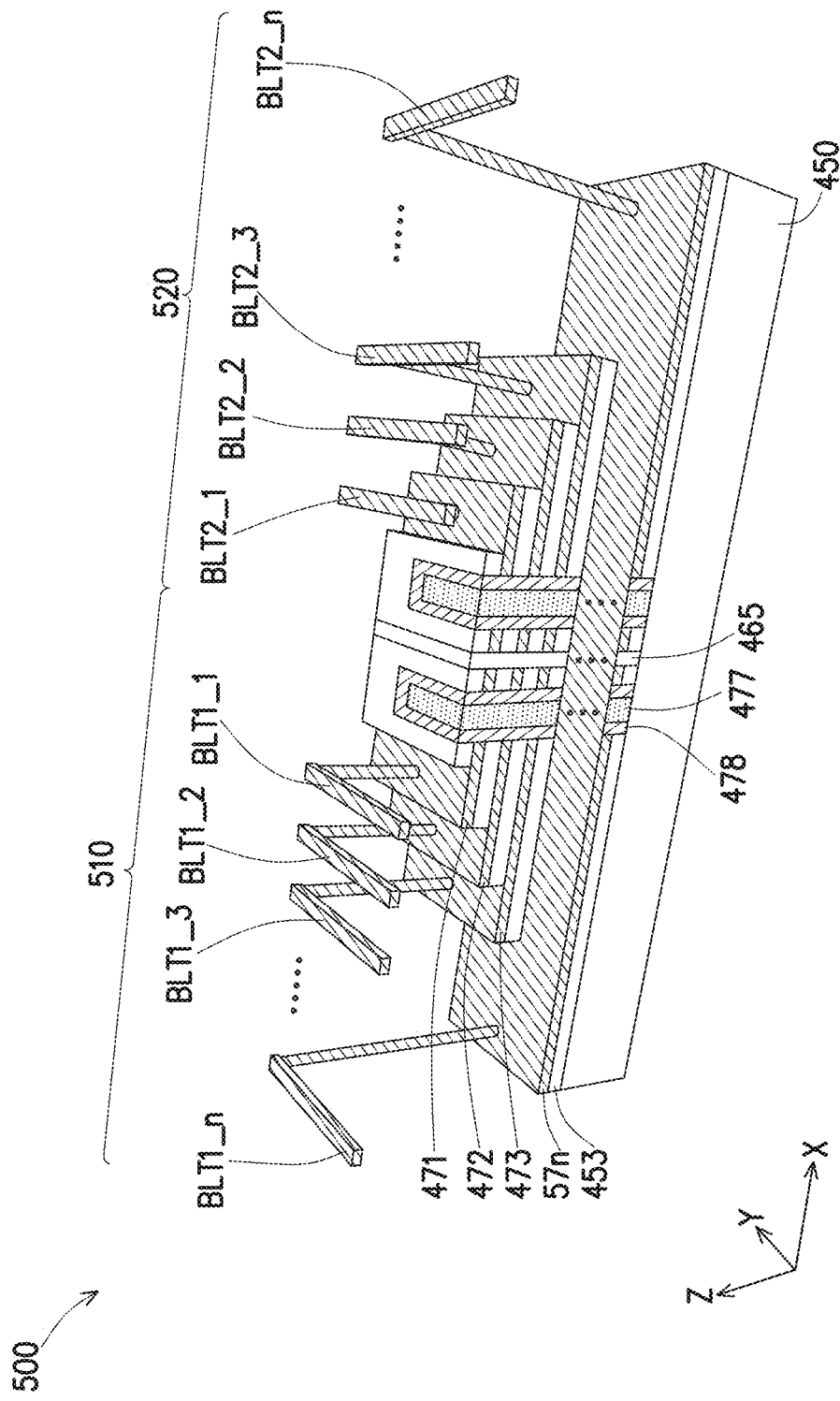
FIG. 5 is a schematic perspective view of an IC device, in accordance with some embodiments.

FIG. 5 is a schematic perspective view of an IC device 500, in accordance with some embodiments. Compared to the IC device 400 which comprises memory cells or regions 410, 420 having the 4T3R configuration, the IC device 500 comprises memory cells or regions having the (n+1)TnR configuration, where n is greater than three. FIG. 5 is a schematic perspective view similar to FIG. 4B. However, for simplicity, the n select transistors, the bit lines BL1, BL2, and the dielectric layer 484 are omitted from FIG. 5.

The IC device 500 comprises two memory cells 510, 520 each comprising n select transistors (not shown) having gates electrically coupled to n select bit lines. For example, the n select bit lines electrically coupled to the memory cell 510 include select bit lines BLT1_1, BLT1_2, BLT1_3, . . . , BLT1_$n$. The n select bit lines electrically coupled to the memory cell 520 include select bit lines BLT2_1, BLT2_2, BLT2_3, . . . , BLT2_$n$. Each memory cell 510, 520 includes n electrode layers. For example, the n electrode layers in the memory cell 510 include electrode layers 471, 472, 473, . . . , 57$n$. The n electrode layers are arranged in a stepwise structure as illustrated in FIG. 5. The n electrode layers, together with the conductor 477 and the dielectric layer 478, define an MIM structure comprising n data storage elements (not shown), in a manner similar to the MIM structure 461 in the IC device 400. In at least one embodiment, one or more advantages described herein are achievable in the IC device 500.

Figure 6B:
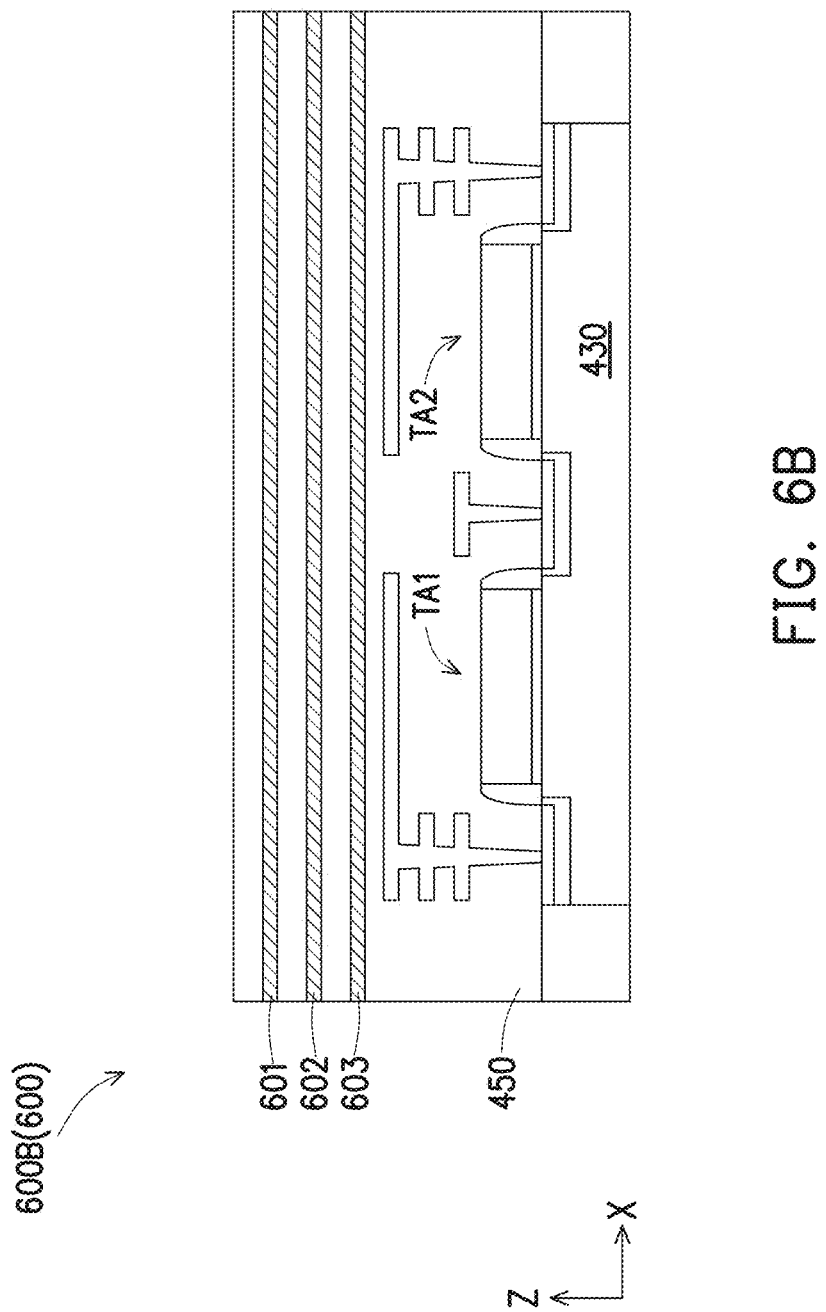
Figure 6C:
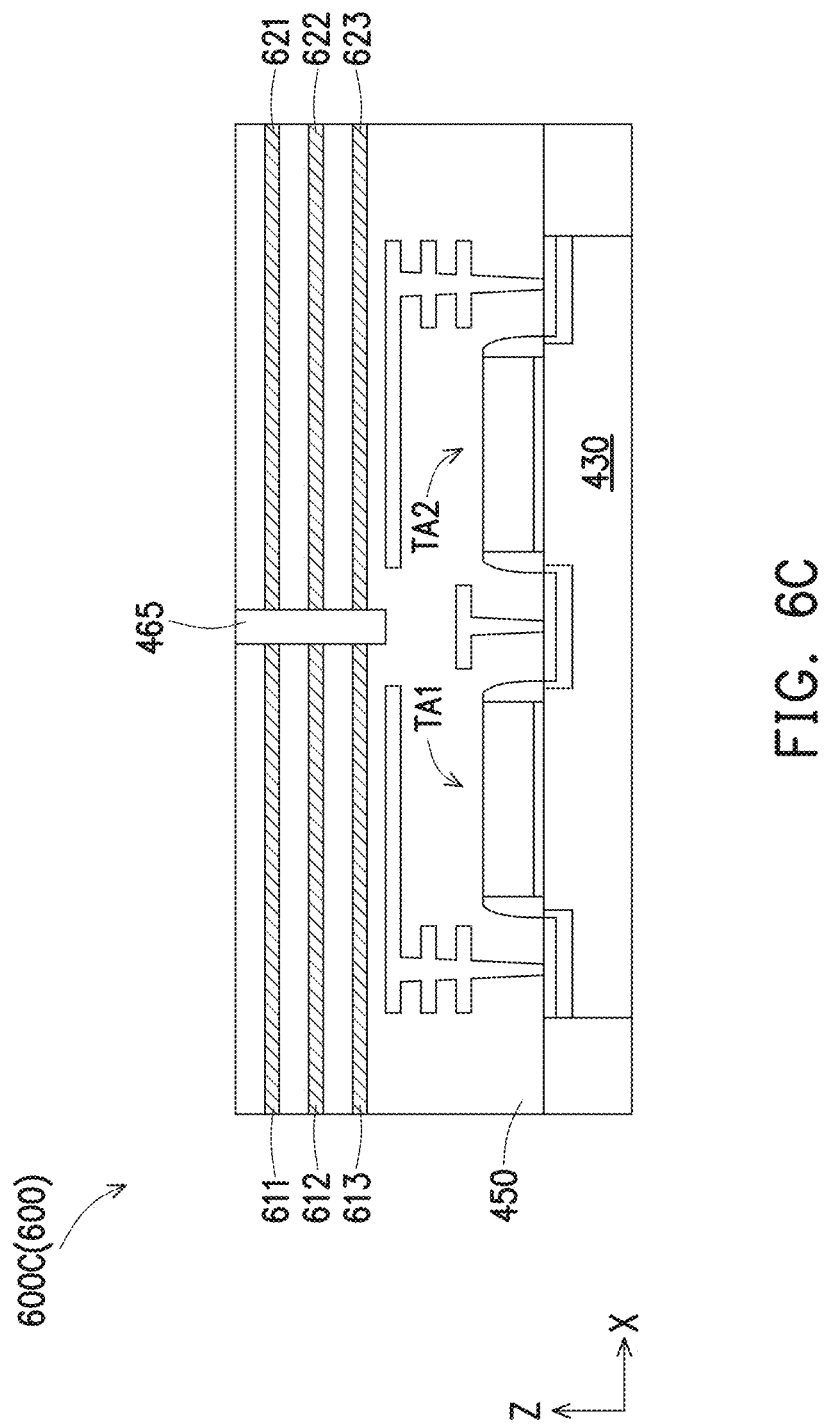
Figure 6D:
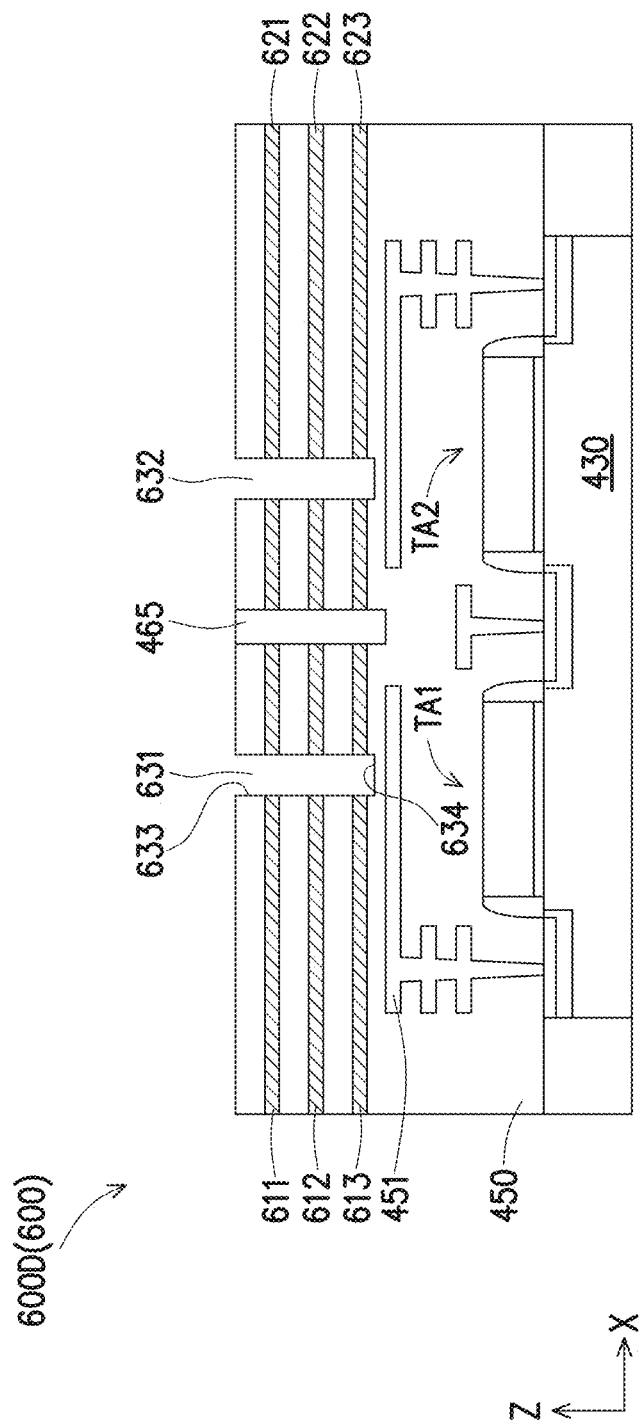
Figure 6E:
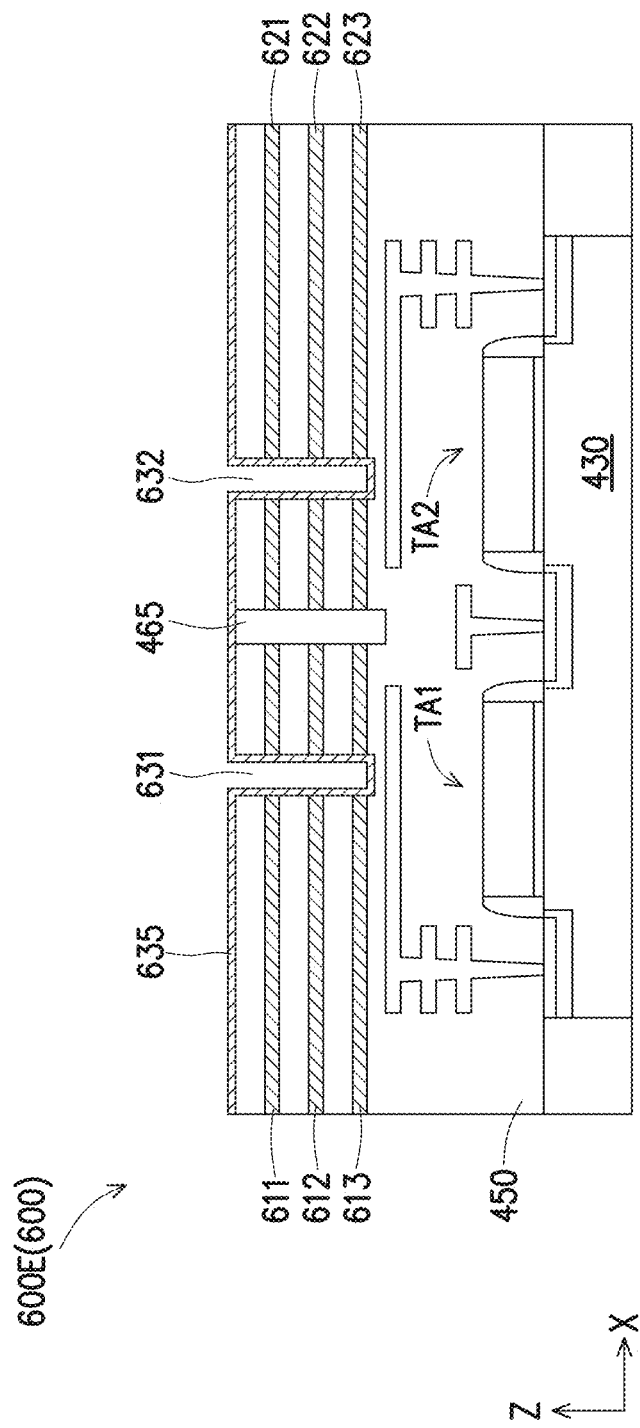
Figure 6F:
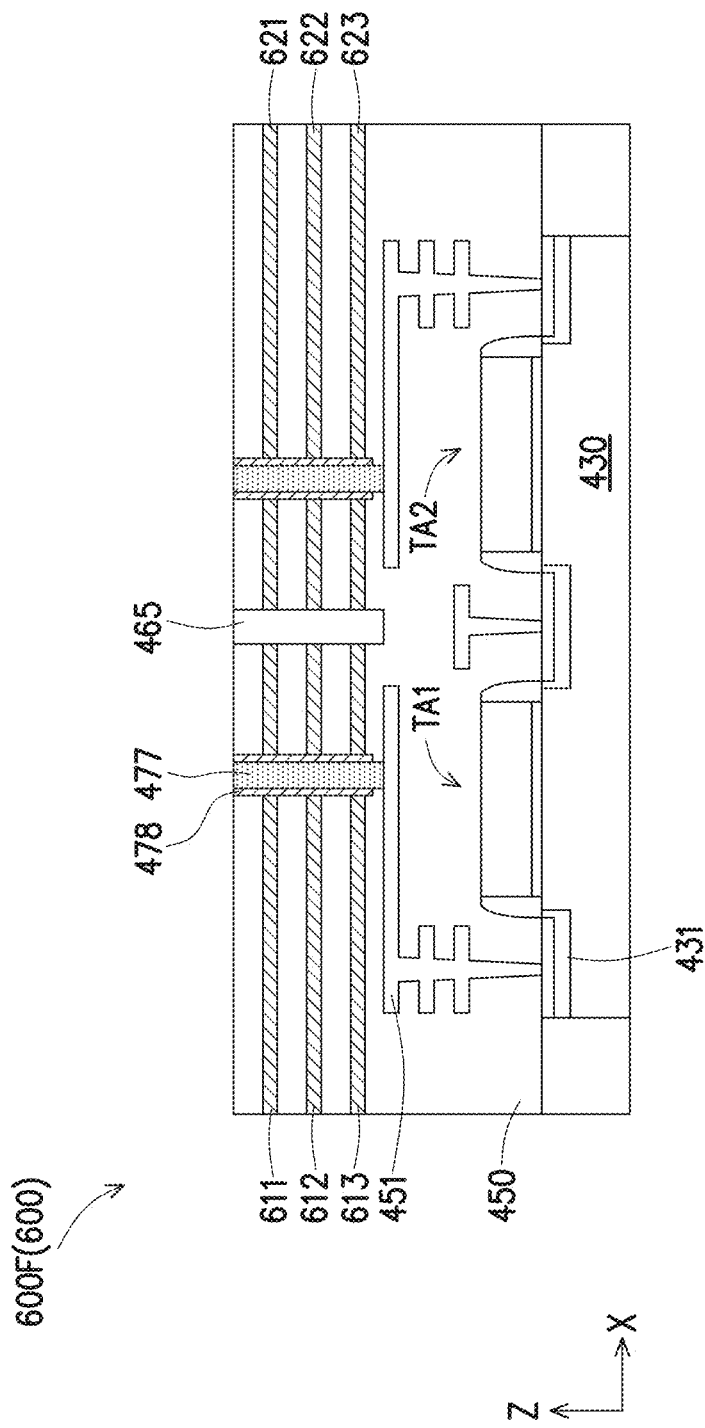
Figure 6G:
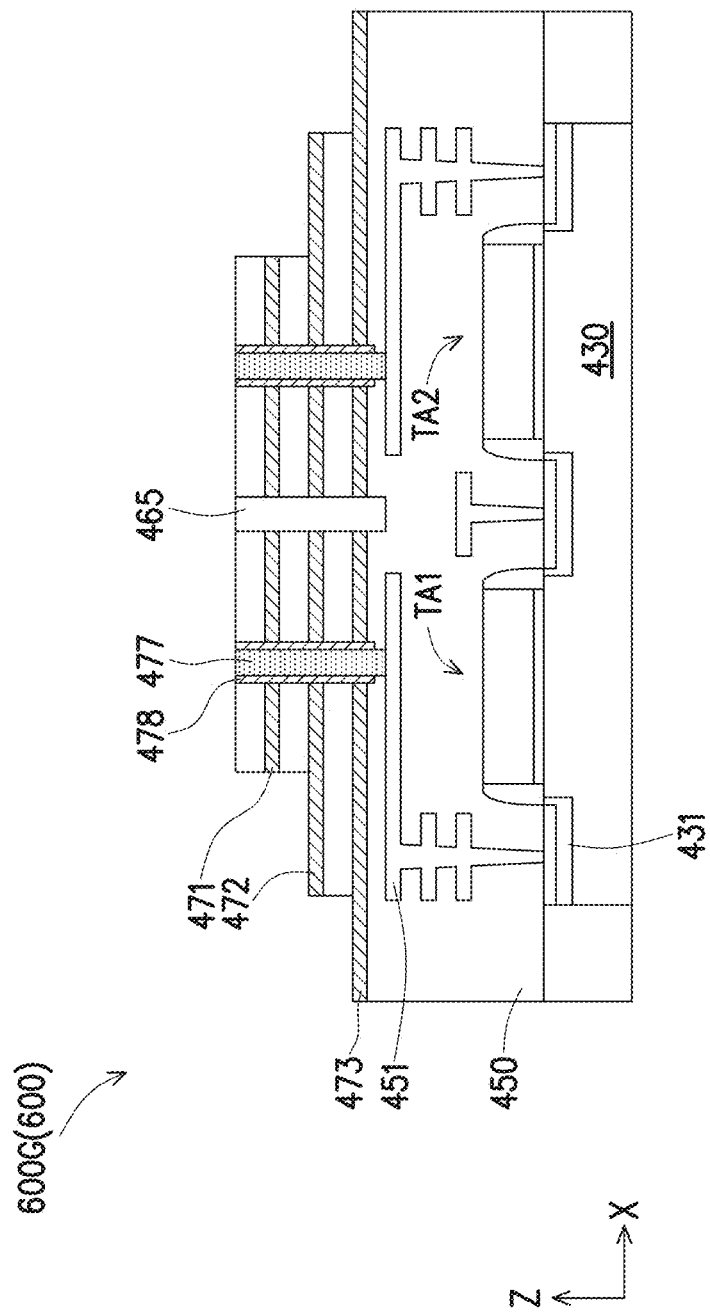
Figure 6H:
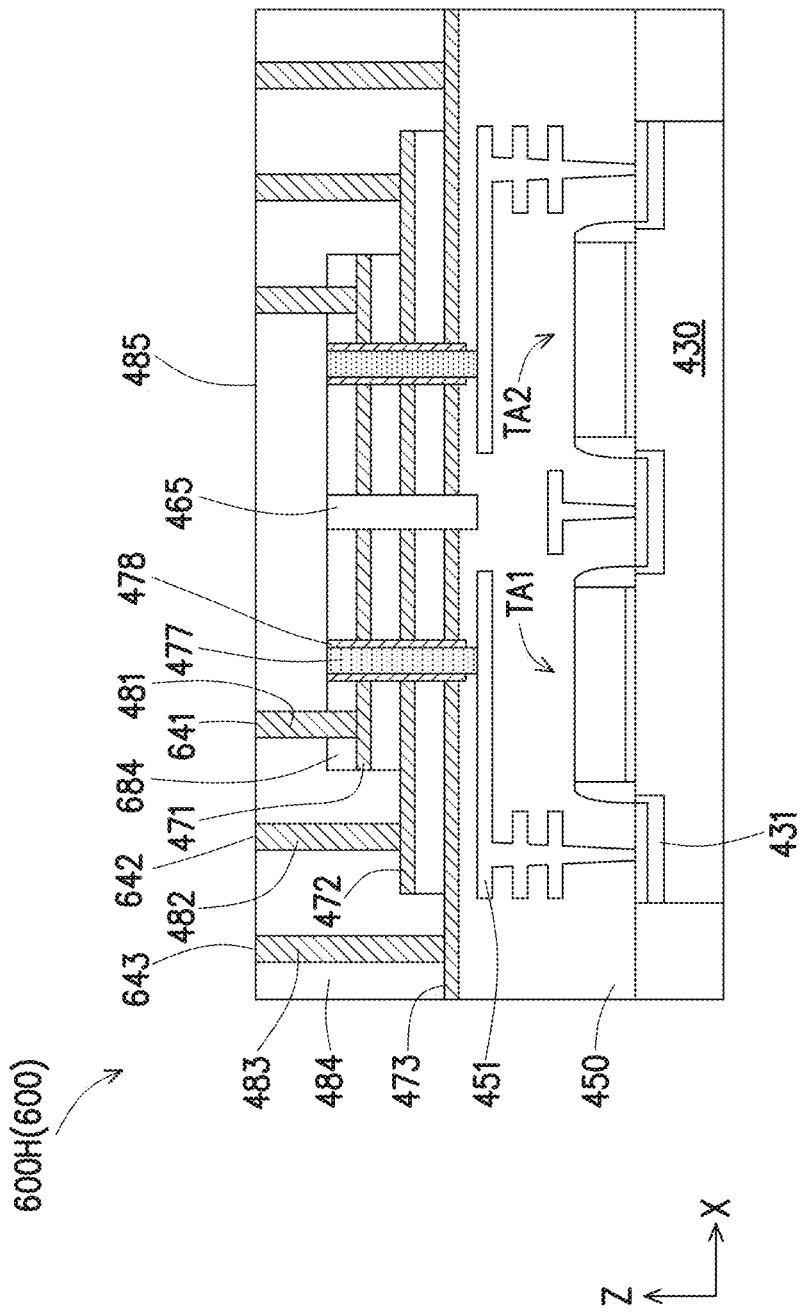
Figure 6I:
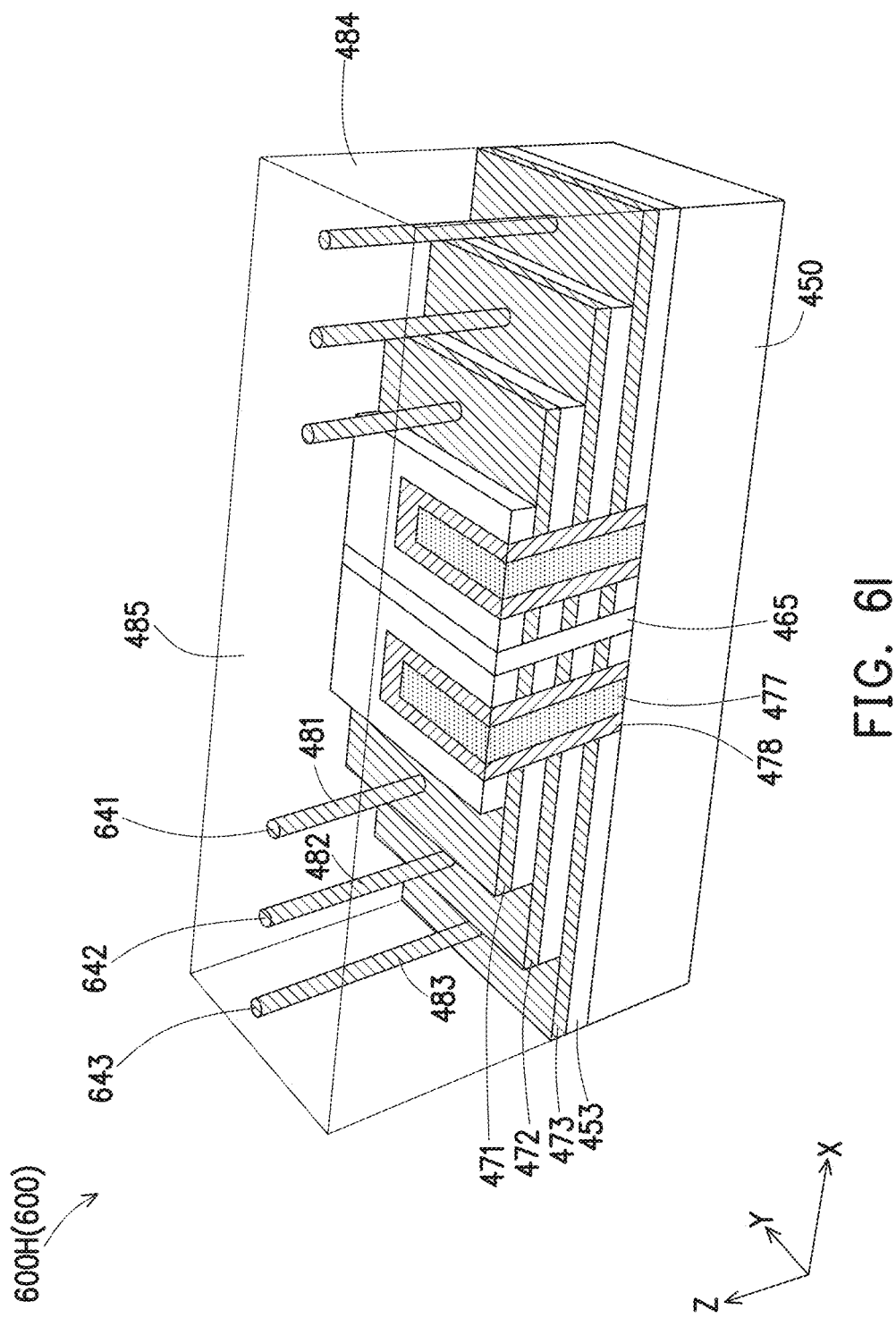
Figure 6J:
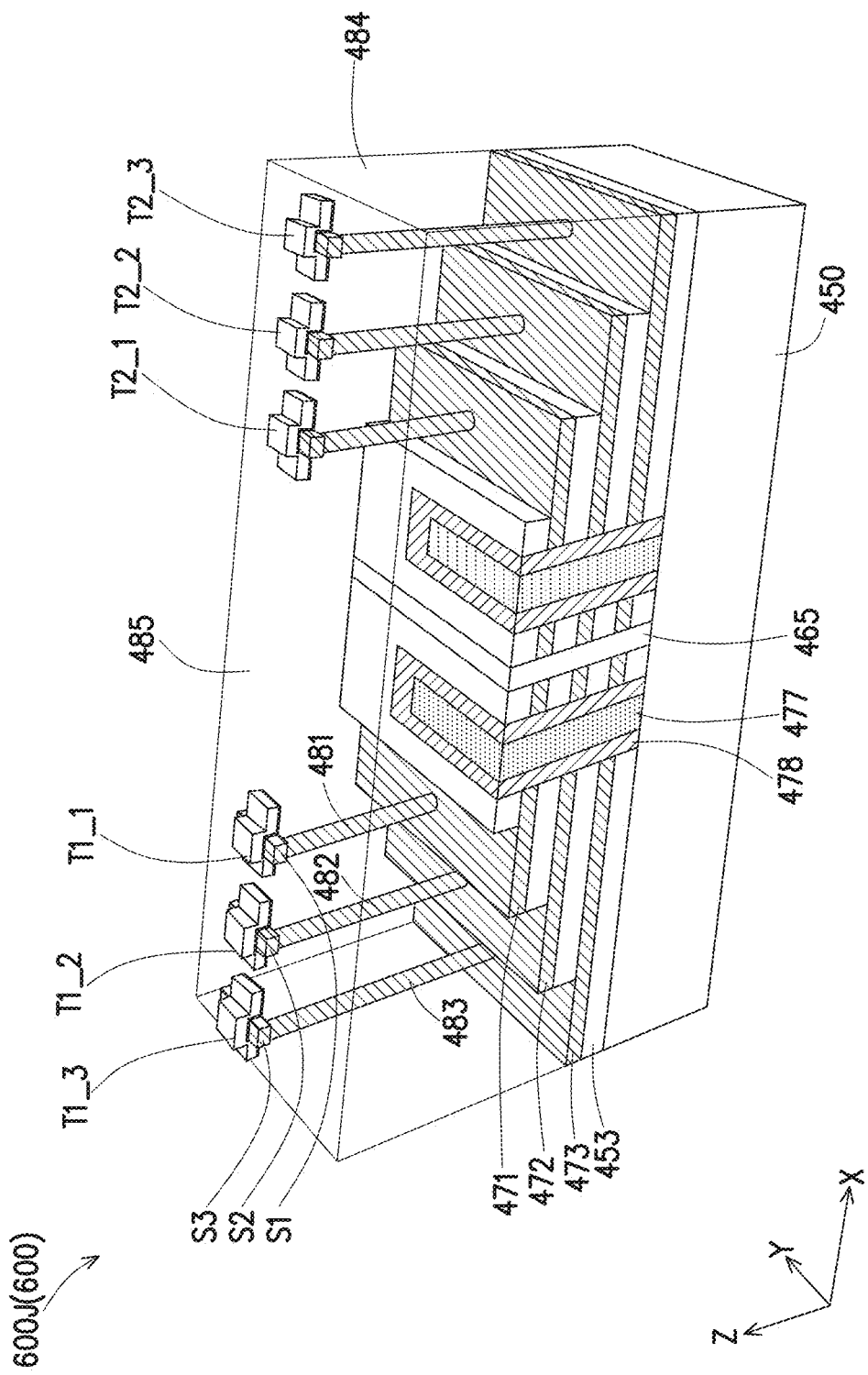

FIGS. 6A-6H are schematic cross-sectional views and FIGS. 6I-6J are schematic perspective views of an IC device 600 being manufactured at various stages of a manufacturing process, in accordance with some embodiments. In at least one embodiment, the IC device 600 corresponds to one or more of the memory device 300 and/or IC device 400 described herein.

In FIG. 6A, the manufacturing process starts from a substrate 430. The substrate 430 comprises, in at least one embodiment, a silicon substrate. The substrate 430 comprises, in at least one embodiment, silicon germanium (SiGe), Gallium arsenic, or other suitable semiconductor materials.

At least one access transistor is formed over the substrate 430 in a front-end-of-line (FEOL) processing. For example, the access transistor TA1 and the access transistor TA2 are formed over the substrate 430. Specifically, source/drain regions 431, 432, 433 are formed in or over the substrate 430, as described herein. Gate dielectrics 434, 436 are deposited over the substrate 430. Example materials of the gate dielectrics include, but are not limited to, a high-k dielectric layer, an interfacial layer, and/or combinations thereof. In some embodiments, the gate dielectric is deposited over the substrate 430 by atomic layer deposition (ALD) or other suitable techniques. Gates 435, 437 are deposited over the gate dielectric. Example materials of the gates include, but are not limited to, polysilicon, metal, Al, AlTi, Ti, TiN, TaN, Ta, TaC, TaSiN, W, WN, MoN, and/or other suitable conductive materials. In some embodiments, the gates are deposited by chemical vapor deposition (CVD), physical vapor deposition (PVD or sputtering), plating, atomic layer deposition (ALD), and/or other suitable processes. Isolation structures 438, 439 are formed in the substrate 430, e.g., by etching corresponding areas of the substrate 430 and filling the etched areas with insulating material.

After the FEOL processing, a back-end-of-line (BEOL) processing is performed to form an interconnect structure 450 over the access transistors to electrically couple various elements or circuits of the IC device 600 with each other, and with external circuitry. In at least one embodiment, the interconnect structure 450 comprises sequentially overlying metal and via layers. The overlying metal layers and via layers correspondingly comprise metal layers M0, M1, or the like, and via layers V0, V1, or the like. In at least one embodiment, the interconnect structure 450 is manufactured sequentially layer by layer upward from the substrate 430. In the example configuration in FIG. 6A, the interconnect structure 450 comprises a source line SL. In some embodiments, the interconnect structure 450 comprises word lines (not shown). The interconnect structure 450 is formed to comprise conductive patterns 451, 452 electrically coupled to the corresponding source/drains of the access transistors TA1, TA2, and an ILD layer 453 over the conductive patterns 451, 452. The ILD layer 453 is planarized. A resulting structure 600A is obtained, as shown in FIG. 6A.

In FIG. 6B, electrode layers for forming first electrodes of data storage elements are deposited. For example, a plurality of electrode layers 601, 602, 603 and ILD layers (not numbered) are sequentially deposited over the interconnect structure 450. Example materials of one or more of the electrode layers 601, 602, 603 include, but are not limited to, Al, Ti, TiN, TaN, Co, Ag, Au, Cu, Ni, Cr, Hf, Ru, W, Pt, or the like. A resulting structure 600B is obtained, as shown in FIG. 6B.

In FIG. 6C, an isolation structure is formed to electrically isolate first electrodes of data storage elements in one memory cell from first electrodes of data storage elements in another memory cell. For example, a via is etched through the electrode layers 601, 602, 603 and ILD layers, and is filled with insulating material to form an isolation structure 465. The isolation structure 465 divides each of the electrode layers 601, 602, 603 into two electrically isolated parts. For example, the electrode layer 601 is divided into electrode layer parts 611, 621, the electrode layer 602 is divided into electrode layer parts 612, 622, the electrode layer 603 is divided into electrode layer parts 613, 623. The electrode layer parts 611, 612, 613 corresponding to first electrodes of data storage elements in one memory cell corresponding to the access transistor TA1. The electrode layer parts 621, 622, 623 corresponding to first electrodes of data storage elements in another memory cell corresponding to the access transistor TA2. In the example configuration in FIG. 6C, the isolation structure 465 extends into the interconnect structure 450. Other configurations are within the scopes of various embodiments. A resulting structure 600C is obtained, as shown in FIG. 6B.

In FIG. 6D, vias or trenches for data storage elements are formed. For example, a via 631 is formed, e.g., by etching, to extend through the electrode layer parts 611, 612, 613, and a via 632 is formed to extend through the electrode layer parts 621, 622, 623. Each via 631, 632 has an inner wall and a bottom wall. For example, the via 631 comprises an inner wall 633 and a bottom wall 634. The bottom wall 634 is located, in the Z direction, between the lowest electrode layer part 613 and the conductive pattern 451 of the interconnect structure 450. The conductive pattern 451 is not yet exposed through the bottom wall 634. The via 632 is formed in a similar manner. A resulting structure 600D is obtained, as shown in FIG. 6D.

In FIG. 6E, a dielectric material for data storage elements is deposited. For example, a dielectric layer 635 is deposited over the resulting structure 600D. The dielectric layer 635 is deposited over the inner wall and the bottom wall of each via 631, 632. Example materials of the dielectric layer 635 include, but are not limited to, $HfO_2$, $Hf_{1-x}Zr_xO_2$, $ZrO_2$, $TiO_2$, NiO, $TaO_x$, $Cu_2O$, $Nb_2O_5$, $Al_2O_3$, or the like. A resulting structure 600E is obtained, as shown in FIG. 6E.

In FIG. 6F, formation of second electrodes of data storage elements is performed. The deposited dielectric layer 635 is removed from a top surface (not numbered) of the resulting structure 600E, leaving a portion of the dielectric layer 635 on the inner wall of each via 631, 632. For example, the dielectric layer 478 is the portion of the dielectric layer 635 left on the inner wall of the via 631. In some embodiments, the removal of the dielectric layer 635 from the top surface of the resulting structure 600E also removes the portion of the dielectric layer 635 on the bottom wall of each via 631, 632, and further exposes the underlying conductive pattern 451, 452. In one or more embodiments, a further etching process is performed to expose the conductive pattern 451, 452. Subsequently, a conductive material is filled into the vias 631, 632 to from electrical contact with the exposed conductive patterns 451, 452. Example materials of the conductive material include, but are not limited to, Al, Ti, TiN, TaN, Co, Ag, Au, Cu, Ni, Cr, Hf, Ru, W, Pt, or the like. As a result, conductors, such as the conductor 477, are obtained in the filled vias 631, 632. The conductor 477 comprise second electrodes of the data storage elements and are electrically coupled to the corresponding source/drain 431 of the corresponding access transistor TA1. A corresponding conductor (not numbered) is similarly formed in the via 632. A resulting structure 600F is obtained, as shown in FIG. 6F.

In FIG. 6G, the first electrodes of the data storage elements are patterned into a stepwise structure. For example, the electrode layer parts 611, 612, 613 are patterned, e.g., by etchings, to have different dimensions in the X direction, resulting in electrode layers 471, 472, 473 arranged in a stepwise structure. The electrode layers 471, 472, 473 define the first electrodes of the data storage elements. The electrode layer parts 621, 622, 623 are patterned in a similar manner. The formation of data storage elements is completed. In some embodiments, the obtained data storage elements are RRAM elements. A resulting structure 600G is obtained, as shown in FIG. 6G.

In FIG. 6H, formation of vias electrically coupled to the first electrodes of the data storage elements is performed. For example, a dielectric layer 484 is deposited over the resulting structure 600G. A via structure 481 is formed through the dielectric layer 484 and an ILD portion 684 of the ILD layer remaining over the electrode layer 471, and via structures via 482, 483 are formed in the dielectric layer 484 to be electrically coupled to the corresponding electrode layers 471, 472, 473. In some embodiments, vias having different heights and corresponding to the via structures 481, 482, 483 are formed in multiple etching operations. For example, in a first etching operation, a first mask is used to etch through the dielectric layer 484 and the ILD portion 684 to the electrode layer 471 to obtain a first via. In a second etching operation, a second mask is used to etch the dielectric layer 484 to the electrode layer 472 to obtain a second via. In a third etching operation, a third mask is used to etch the dielectric layer 484 to the electrode layer 473 to obtain a third via. In at least one embodiment, the first through third vias having different heights are simultaneously formed in an etching operation. For example, an etch selectivity between a dielectric material of the dielectric layer 484 and the ILD portion 684 and a conductive material of the electrode layers 471, 472, 473 is high, making it possible to form the first through third vias by a highly selective etching operation. In at least one embodiment, the ILD portion 684 and the dielectric layer 484 are of the same material. As a result, it is possible to etch the first through third vias simultaneously with high-selectivity etching to stop the etching reliably on the electrode layers 471, 472, 473, respectively. A conductive material is filled in the first through third vias to form the corresponding via structures 481, 482, 483. A planarization process is performed, resulting in a top surface 485 of the dielectric layer 484. The via structures via 481, 482, 483 have corresponding upper ends 641, 642, 643 exposed at the top surface 485. A resulting structure 600H is obtained, as shown in FIG. 6H.

FIG. 6I is a schematic perspective view of the resulting structure 600H. As illustrated in FIG. 6I, the upper ends 641, 642, 643 of the via structures 481, 482, 483 are exposed at the top surface 485 of the dielectric layer 484. For simplicity, the ILD portion 684 is omitted in FIGS. 6I-6J.

In FIG. 6J, select transistors over the exposed upper ends of the via structures. An active channel layer is deposited over the top surface 485 of the dielectric layer 484, and patterned to form a first source/drain of a select transistor over and in electrical contact with the exposed upper end of a corresponding via structure. For example, the first source/drains S1, S2, S3 of select transistors T1_1, T1_2, T1_3 are formed over and in electrical contact with the exposed upper ends (641, 642, 643 in FIG. 6I) of the corresponding via structures 481, 482, 483. In some embodiments, a conductive material is formed as contact structures over the exposed upper ends of the via structures 481, 482, 483 before depositing the active channel layer. In some embodiments, a doping process and/or an annealing process is/are performed on the active channel layer. Example channel materials of the active channel layer include, but are not limited to ZnO, IGZO, IWO, ITO, polysilicon, amorphous Si, or the like. A gate dielectric is formed over the active channel layer, and a gate electrode is formed over the gate dielectric, for example, as described with respect to FIG. 4C. In at least one embodiment, the gate electrode is formed by a gate replacement process. Example materials of the gate dielectric include, but are not limited to, silicon oxide, silicon nitride, or a high-k dielectric material. Example high-k dielectric materials include, but are not limited to, HfO₂, HfSiO, HfSiON, HfTiO, HfTaO, HfZrO, titanium oxide, aluminum oxide, and zirconium oxide. Example materials of the gate electrode include, but are not limited to metal and polysilicon. A resulting structure 600J is obtained, as shown in FIG. 6J.

In at least one embodiment, the select transistors are manufactured at a temperature not greater than 400° C. which is compatible with BEOL processes. This compatibility with BEOL processes is a further advantage obtainable by memory devices and/or IC devices in accordance with some embodiments.

After the formation of the select transistors, various ILD layers and metal layers are formed over the select transistors, to form select bit lines, bit lines and electrical connections from the select bit lines and bit lines to the corresponding select transistors. In some embodiments, a resulting structure corresponds to the IC device 400 shown in FIG. 4B. In some embodiments, one or more further metal layers and/or via layers are formed over the resulting structure to complete the IC device 600. The described manufacturing process in an example. Other manufacturing processes are within the scopes of various embodiments. In at least one embodiment, one or more advantages described herein are achievable in an IC device and/or memory device manufactured in accordance with the described manufacturing process.

Figure 7:
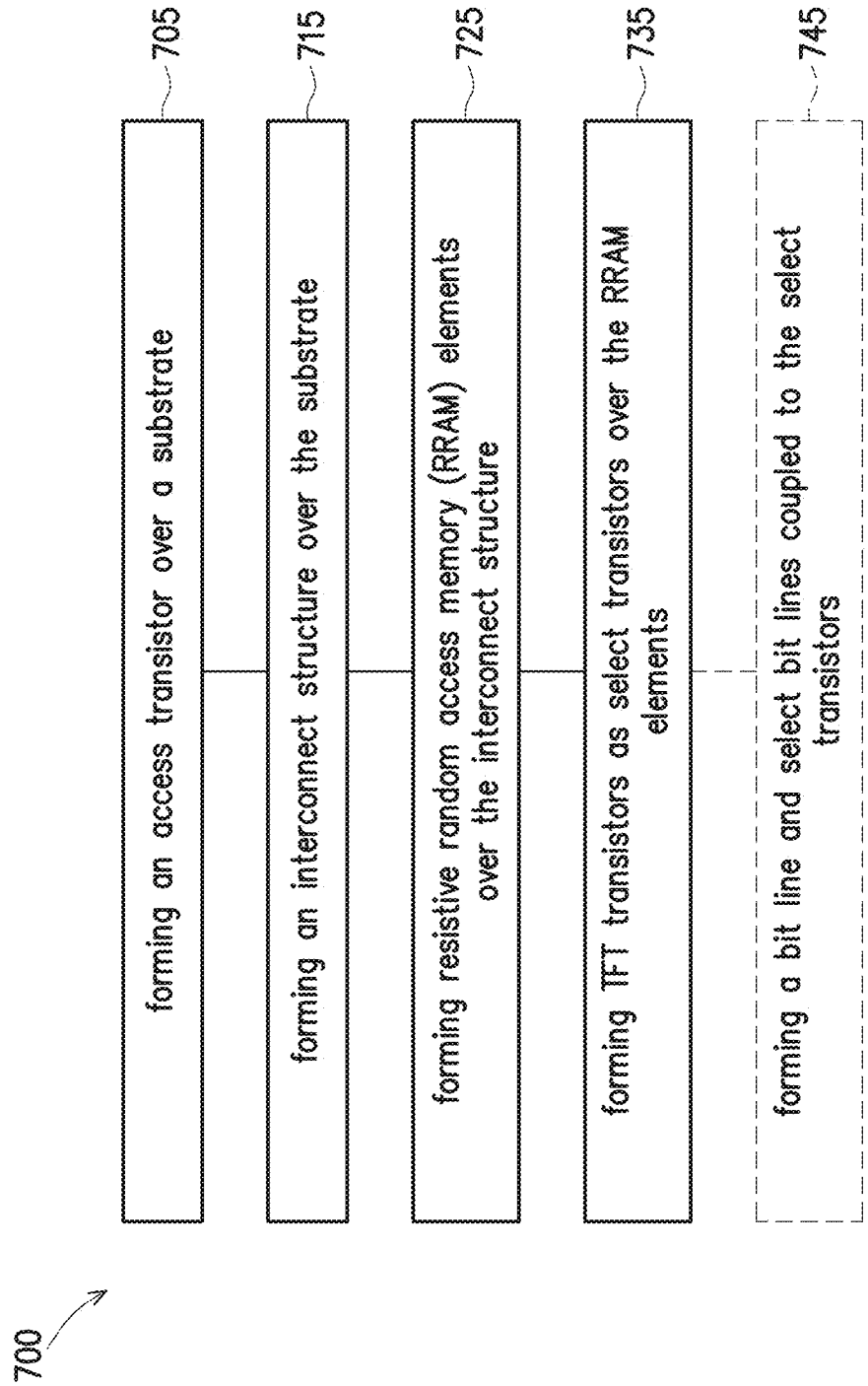
FIG. 7 is a flow chart of a method, in accordance with some embodiments.

FIG. 7 is a flow chart of a method 700 of manufacturing an IC device, in accordance with some embodiments. In at least one embodiment, the IC device is manufactured in accordance with the manufacturing method 700 corresponds to one or more of the memory devices and/or IC devices described herein.

At operation 705, an access transistor is formed over a substrate. For example, an access transistor TA1 is formed over a substrate 430, as described with respect to FIG. 6A.

At operation 715, an interconnect structure is formed over the substrate. For example, an interconnect structure 450 is formed over the substrate 430, as described with respect to FIG. 6A.

At operation 725, a plurality of resistive random access memory (RRAM) elements is formed over the interconnect structure 450. The interconnect structure 450 electrically couples a first electrode of each of the RRAM elements to a first source/drain of the access transistor. For example, as described with respect to FIG. 4A, data storage elements R1_1, R1_2, R1_3, which are RRAM elements in at least one embodiment, are formed in a MIM structure 461. A conductive pattern 451 in the interconnect structure 450 electrically couples an electrode, i.e., conductor 477, of each of the data storage elements R1_1, R1_2, R1_3 to a first source/drain 431 of the access transistor TA1. Example processes for manufacturing data storage elements R1_1, R1_2, R1_3 are described with respect to FIGS. 6B-6G.

At operation 735, a plurality select transistors are formed as select transistors over the RRAM elements. A second electrode of each of the RRAM elements is electrically coupled to a first source/drain of a corresponding select transistor. For example, select transistors T1_1, T1_2, T1_3 are formed over the data storage elements R1_1, R1_2, R1_3, as described with respect to FIG. 4A. Further electrodes 471, 472, 473 of the data storage elements R1_1, R1_2, R1_3 are electrically coupled to first source/drains S1, S2, S3 of the corresponding select transistors T1_1, T1_2, T1_3, as described with respect to FIG. 4B. Example processes for manufacturing the select transistors T1_1, T1_2, T1_3 are described with respect to FIG. 6J.

At operation 745, a plurality bit line and select bit lines are formed over and coupled to the select transistors. For example, as described with respect to FIG. 4B, a bit line BL1 is formed over the select transistors T1_1, T1_2, T1_3, and is electrically coupled to second source/drains of the select transistors T1_1, T1_2, T1_3 by via structures 491, 492, 493. Select bit lines BLT1_1, BLT1_2, BLT1_3 are also formed over the select transistors T1_1, T1_2, T1_3, and are electrically coupled to gates of the select transistors T1_1, T1_2, T1_3. In some embodiments, a word line WL1 and a source line SL are formed in the interconnect structure 450 and coupled to the access transistor TA1, as described with respect to FIG. 4A and/or FIG. 6A. As a result, the access transistor TA1, the data storage elements R1_1, R1_2, R1_3 and the select transistors T1_1, T1_2, T1_3 are electrically coupled to each other, to form a memory circuit corresponding to the memory cell 310 described with respect to FIG. 3.

In some embodiments, one or more memory cells, memory devices, IC devices, and methods described are applicable to various types of transistor or device technologies including, but not limited to, planar transistor technology, FINFET technology, nanosheet FET technology, nanowire FET technology, or the like. One or more memory cells, memory devices, IC devices, and methods in accordance with some embodiments are also compatible with various technology nodes.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, a memory device comprises at least one bit line, at least one word line, at least one memory cell, a plurality of select bit lines, and a controller electrically coupled to the at least one memory cell via the at least one word line, the at least one bit line, and the plurality of select bit lines. The memory cell comprises a first transistor, a plurality of data storage elements, and a plurality of second transistors corresponding to the plurality of data storage elements. The first transistor comprises a gate electrically coupled to the word line, a first source/drain, and a second source/drain. Each of the plurality of select bit lines is electrically coupled to a gate of a corresponding second transistor among the plurality of second transistors. Each data storage element among the plurality of data storage elements and the corresponding second transistor are electrically coupled in series between the first source/drain of the first transistor and the bit line. The controller is configured to turn ON the first transistor and a selected second transistor among the plurality of second transistors, correspondingly through the at least one word line and the select bit line coupled to the selected second transistor. The controller is further configured to, while the first transistor and the selected second transistor are turned ON, apply different voltages to the at least one bit line, the different voltages corresponding to different operations to be performed on the data storage element coupled to the selected second transistor.

In some embodiments, an integrated circuit (IC) device comprises a substrate having thereon a first transistor, a plurality of data storage elements arranged at different heights over the substrate, a plurality of second transistors over the plurality of data storage elements, a word line coupled to a gate of the first transistor, and a plurality of select bit lines each electrically coupled to a gate of a corresponding second transistor among the plurality of second transistors. Each data storage element among the plurality of data storage elements is electrically coupled in series between a first source/drain of the first transistor and a first source/drain of a corresponding second transistor among the plurality of second transistors.

In some embodiments, a method comprises forming a first transistor over a substrate, forming an interconnect structure over the substrate, forming a plurality of data storage elements and a stepwise structure over the interconnect structure, and forming a plurality of second transistors over the plurality of data storage elements and the stepwise structure. The interconnect structure electrically couples a first electrode of each of the plurality of data storage elements to a first source/drain of the first transistor. A second electrode of each of the plurality of data storage elements is electrically coupled by the stepwise structure to a first source/drain of a corresponding second transistor among the plurality of second transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    at least one bit line;
    at least one word line;
    at least one memory cell comprising:
        a first transistor comprising a gate electrically coupled to the word line, a first source/drain, and a second source/drain;
        a plurality of data storage elements; and
        a plurality of second transistors corresponding to the plurality of data storage elements;
    a plurality of select bit lines each electrically coupled to a gate of a corresponding second transistor among the plurality of second transistors; and
    a controller electrically coupled to the at least one memory cell via the at least one word line, the at least one bit line, and the plurality of select bit lines,
    wherein each data storage element among the plurality of data storage elements and the corresponding second transistor are electrically coupled in series between the first source/drain of the first transistor and the bit line, and
    wherein the controller is configured to
        turn ON the first transistor and a selected second transistor among the plurality of second transistors, correspondingly through the at least one word line and the select bit line coupled to the selected second transistor, and
        while the first transistor and the selected second transistor are turned ON, apply different voltages to the at least one bit line, the different voltages corresponding to different operations to be performed on the data storage element coupled to the selected second transistor.

2. The memory device of claim 1, wherein
    each data storage element among the plurality of data storage elements is a non-volatile, reprogrammable data storage element.

3. The memory device of claim 1, wherein each data storage element among the plurality of data storage elements comprises
    a first electrode,
    a second electrode, and
    a dielectric material sandwiched between the first electrode and the second electrode, and electrically switchable between
        a first state corresponding to a first logic value stored in the data storage element, and
        a second state corresponding to a second logic value stored in the data storage element.

4. The memory device of claim 1, wherein
each data storage element among the plurality of data storage elements is a resistive random access memory (RRAM) element.

5. The memory device of claim 1, wherein
the controller is configured to, in a reset operation of a selected data storage element among the plurality of data storage elements,
apply a turn-ON voltage via the at least one word line to the gate of the first transistor to turn ON the first transistor,
apply a further turn-ON voltage via the corresponding select bit line to the gate of the second transistor corresponding to the selected data storage element,
apply a turn-OFF voltage via the corresponding select bit lines to the gates of other second transistors among the plurality of second transistors, and
while the first transistor and the second transistor corresponding to the selected data storage element are turned ON and the other second transistors are turned OFF, apply a reset voltage to the at least one bit line to switch a datum stored in the selected data storage element from a first logic value to a second logic value.

6. The memory device of claim 1, further comprising:
at least one source line electrically coupled to the second source/drain of the first transistor, wherein
the controller is electrically coupled to the at least one memory cell further via the at least one source line, and
the controller is configured to, in a reset operation of a selected data storage element among the plurality of data storage elements,
apply a turn-ON voltage via the at least one word line to the gate of the first transistor to turn ON the first transistor,
apply a further turn-ON voltage via the corresponding select bit line to the gate of the second transistor corresponding to the selected data storage element,
apply a turn-OFF voltage via the corresponding select bit lines to the gates of other second transistors among the plurality of second transistors, and
while the first transistor and the second transistor corresponding to the selected data storage element are turned ON and the other second transistors are turned OFF, apply a reset voltage to one of the at least one bit line and the at least one source line while grounding the other of the at least one bit line and the at least one source line, to switch a datum stored in the selected data storage element from a first logic value to a second logic value.

7. The memory device of claim 1, wherein
the at least one bit line comprises first and second bit lines,
the at least one word line comprises first and second word lines,
the at least one memory cell comprises first and second memory cells,
the memory device further comprises a common source line electrically coupled to the second source/drains of the first transistors of the first and second memory cells, and
the plurality of select bit lines comprises:
a plurality of first select bit lines each electrically coupled to a gate of a corresponding second transistor among the plurality of second transistors in the first memory cell; and
a plurality of second select bit lines each electrically coupled to a gate of a corresponding second transistor among the plurality of second transistors in the second memory cell.

8. The memory device of claim 1, further comprising:
a substrate having thereon the first transistor;
an interconnect structure over the substrate; and
a metal-insulator-metal (MIM) structure over the interconnect structure and comprising the plurality of data storage elements stacked on top each other in a thickness direction of the substrate, the interconnect structure electrically coupling the first source/drain of the first transistor to the MIM structure,
wherein the plurality of second transistors is over the MIM structure, and electrically coupled correspondingly to the plurality of data storage elements in the MIM structure.

9. An integrated circuit (IC) device, comprising:
a substrate having thereon a first transistor;
a plurality of data storage elements arranged at different heights over the substrate;
a plurality of second transistors over the plurality of data storage elements;
a word line coupled to a gate of the first transistor; and
a plurality of select bit lines each electrically coupled to a gate of a corresponding second transistor among the plurality of second transistors,
wherein each data storage element among the plurality of data storage elements is electrically coupled in series between a first source/drain of the first transistor and a first source/drain of a corresponding second transistor among the plurality of second transistors.

10. The IC device of claim 9, further comprising:
a metal-insulator-metal (MIM) structure over the substrate, the MIM structure comprising the plurality of data storage elements.

11. The IC device of claim 10, wherein
each data storage element among the plurality of data storage elements is a resistive random access memory (RRAM) element.

12. The IC device of claim 9, wherein
the plurality of data storage elements is arranged on top each other in a thickness direction of the substrate,
each data storage element among the plurality of data storage elements comprises a first electrode, a second electrode, and a dielectric material sandwiched between the first electrode and the second electrode,
the first electrodes of the plurality of data storage elements are arranged on top each other in the thickness direction, and electrically coupled correspondingly to the first source/drains of the plurality of second transistors, and
the second electrodes of the plurality of data storage elements are electrically coupled to the first source/drain of the first transistor.

13. The IC device of claim 12, further comprising:
a plurality of electrode layers arranged on top of each other in the thickness direction of the substrate, and electrically isolated from each other by interlayer dielectric (ILD) layers;
a via extending in the thickness direction through the plurality of electrode layers and the ILD layers;
a dielectric layer over an inner wall of the via; and
a conductor in the via,
wherein
the plurality of electrode layers correspondingly comprises the first electrodes of the plurality of data storage elements,
the conductor comprises the second electrodes of the plurality of data storage elements, and the dielectric layer comprises a plurality of portions each sandwiched between the conductor and the first electrode of a corresponding data storage element among the plurality of data storage elements, and defining the dielectric material of the corresponding data storage element.

14. The IC device of claim 13, further comprising:
a plurality of via structures electrically coupling the first electrodes of the plurality of data storage elements correspondingly to the first source/drains of the plurality of second transistors,
wherein
the first electrodes of the plurality of data storage elements are arranged in a stepwise structure, and
the plurality of via structures has different heights.

15. The IC device of claim 9, further comprising:
a bit line over the plurality of second transistors, and electrically coupled to second source/drains of the plurality of second transistors,
wherein
the bit line extends in a first direction, and
the plurality of select bit lines extends in a second direction transverse to the first direction.

16. The IC device of claim 9, further comprising:
a further first transistor on the substrate;
a plurality of further data storage elements arranged at different heights over the substrate; and
a plurality of further second transistors over the plurality of further data storage elements;
wherein
each further data storage element among the plurality of further data storage elements is electrically coupled in series between a first source/drain of the further first transistor and a first source/drain of a corresponding further second transistor among the plurality of further second transistors, and
a second source/drain of the first transistor is a second source/drain of the further first transistor.

17. The IC device of claim 9, wherein
the plurality of second transistors comprises thin-film transistors (TFT).

18. A method, comprising:
forming a first transistor over a substrate;
forming an interconnect structure over the first transistor;
forming a plurality of data storage elements and a stepwise structure over the interconnect structure, the interconnect structure electrically coupling a first electrode of each of the plurality of data storage elements to a first source/drain of the first transistor; and
forming a plurality of second transistors over the plurality of data storage elements and the stepwise structure, a second electrode of each of the plurality of data storage elements electrically coupled by the stepwise structure to a first source/drain of a corresponding second transistor among the plurality of second transistors.

19. The method of claim 18, wherein said forming the plurality of data storage elements and the stepwise structure comprises:
alternatingly depositing a plurality of electrode layers and interlayer dielectric (ILD) layers over the interconnect structure;
forming a via through the plurality of electrode layers and ILD layers;
depositing a dielectric layer over an inner wall and a bottom wall of the via;
removing the dielectric layer on the bottom wall of the via to expose a conductive pattern of the interconnect structure, the conductive pattern electrically coupled to the first source/drain of the first transistor;
filling a conductive material into the via; and
patterning the plurality of electrode layers and ILD layers to obtain the stepwise structure.

20. The method of claim 19, further comprising:
depositing an insulating layer over the stepwise structure;
forming a plurality of via structures in the insulating layer over the stepwise structure, the plurality of via structures having different heights and electrically coupled correspondingly to the plurality of electrode layers,
wherein in said forming the plurality of second transistors, a first source/drain of each of the plurality of second transistors is formed over and in electrical contact with an upper end of a corresponding via structure among the plurality of via structures;
forming a bit line over the plurality of second transistors, the bit line electrically coupled to second source/drains of the plurality of second transistors; and
forming a plurality of select bit lines over the plurality of second transistors, the plurality of select bit lines electrically coupled correspondingly to gates of the plurality of second transistors.

* * * * *